United States Patent [19]

Tsuchiya et al.

[11] Patent Number: 5,179,565
[45] Date of Patent: Jan. 12, 1993

[54] LOW NOISE PULSED LIGHT SOURCE UTILIZING LASER DIODE AND VOLTAGE DETECTOR DEVICE UTILIZING SAME LOW NOISE PULSED LIGHT SOURCE

[75] Inventors: Yutaka Tsuchiya, Hamamatsu; Shinichiro Aoshima, Iwata; Hironori Takahashi; Takuya Nakamura, both of Hamamatsu, all of Japan

[73] Assignee: Hamamatsu Photonics, K.K., Shizuoka, Japan

[21] Appl. No.: 710,392

[22] Filed: Jun. 5, 1991

[30] Foreign Application Priority Data

Jun. 7, 1990 [JP] Japan .................. 2-148943

[51] Int. Cl.[5] .............................. H01S 3/00
[52] U.S. Cl. ...................... 372/38; 372/26; 372/87; 372/9; 372/27
[58] Field of Search ............... 372/38, 29, 12, 87, 372/26, 9, 27; 324/77 K, 96; 350/385

[56] References Cited

U.S. PATENT DOCUMENTS

| | | |
|---|---|---|
| 4,450,564 | 5/1984 | Meuleman et al. . |
| 4,611,352 | 9/1986 | Fujito et al. . |
| 4,689,795 | 8/1987 | Yoshimoto et al. . |
| 4,698,817 | 10/1987 | Burley . |
| 4,748,633 | 5/1988 | Negishi .................. 372/38 |
| 4,799,069 | 1/1989 | Sasaki et al. . |
| 4,802,179 | 1/1989 | Negishi .................. 372/38 |
| 4,813,048 | 3/1989 | Yamane et al. . |
| 4,819,242 | 4/1989 | Kaku et al. . |
| 4,884,280 | 11/1989 | Kinoshita . |
| 4,945,541 | 7/1990 | Nakayama ............... 372/38 |

FOREIGN PATENT DOCUMENTS

| | | |
|---|---|---|
| 0218449 | 4/1987 | European Pat. Off. . |
| 0221710 | 5/1987 | European Pat. Off. . |
| 0293841 | 12/1988 | European Pat. Off. . |
| 0293842 | 12/1988 | European Pat. Off. . |
| 0299432 | 1/1989 | European Pat. Off. . |
| 0411641 | 2/1991 | European Pat. Off. . |
| 6388-40/MS | 9/1991 | European Pat. Off. . |
| 57-83079 | 5/1982 | Japan . |
| 62-109382 | 5/1987 | Japan . |
| 1-281782 | 11/1989 | Japan . |

2209598 5/1989 United Kingdom .

OTHER PUBLICATIONS

Y. Tsuchiya et al., "Stable Ultrashort Laser Diode Pulse Generator", 1981 American Institute of Physics, Rev. Sci. Instrum., 52(4), Apr. 1981, pp. 579–581.

Pao-Lo Liu et al., "Picosecond Pulse Generation from InGaAsP Lasers at 1.25 and 1.3 μm by Electrical Pulse Pumping", 1981 IEEE, IEEE Journal of Quantum Electronics, vol. QE–17, No. 5, May 1981, pp. 671–674.

Janis A. Valdmanis et al., "Subpicosecond Electrooptic Sampling: Principles and Applications", 1986 IEEE, IEEE Journal of Quantum Electronics, vol. QE–22, No. 1, Jan. 1986, pp. 69–78.

H. Yokoyama et al., "Application of Picosecond Light Pulses Generated from an AlGaInP Visible Diode Laser for Photoluminescence Decay Measurement of GaAs/AlGaAs quantum wells", 1988 American Institute of Physics, Rev. Sci. Instrum. 59(4), Apr. 1988, pp. 663–665.

Primary Examiner—Léon Scott, Jr.
Attorney, Agent, or Firm—Oliff & Berridge

[57] ABSTRACT

A low noise pulsed light source utilizing a laser diode for generating a short pulsed light of a high repetitive frequency. The low noise pulsed light source includes a laser diode driven by an electric pulse generator for emitting repetitive pulsed light; a current source for supplying a bias current to the laser diode; and a photodetector for detecting the repetitive pulsed light emitted from the laser diode; and control means. The control means modulates at least one of the bias current from the current source and the amplitude of a pulse signal generated from the electric pulse generator in accordance with an output signal from the photodetector such that the intensity of the pulsed light is kept unchanged and any noise involved in the same is reduce. A feedback system including the photodetector and the control means has a peak in its frequency characteristics within a frequency band for light detecting in a light measuring system utilizing the low noise pulsed light source.

12 Claims, 20 Drawing Sheets

LOW NOISE PULSED LIGHT SOURCE UTILIZING LASER DIODE AND VOLTAGE DETECTOR DEVICE UTILIZING SAME LOW NOISE PULSED LIGHT SOURCE

BACKGROUND OF THE INVENTION

1. Field of the Invention

The present invention relates to a pulsed light source utilizing a laser diode for generating a short pulsed light of a high repetitive frequency (200 to 2 picosecond pulse width, for example), and more specifically to a low noise pulsed light source capable of generating an optical pulse with reduced light intensity noise and to a voltage detector device utilizing the same low noise pulsed light source.

2. Description of the Prior Art

An emitted light from a laser diode (LD) changes in its wavelength and intensity as an excitation current and ambient temperature vary. The intensity of the emitted light also changes owing to the competition among longitudinal modes and owing to mode hopping. For a method of reducing such variations of the light intensity, there is known a technique wherein a photodetector element such as a photodiode (PD) detects part of the emitted light from a laser diode to estimate an error signal between a detected light intensity level and a preset one which is in turn fed back to an excitation current source which is to drive the laser diode. Such a technique has already been used for an optical pick-up of a compact disk (CD) player and so on.

However, all prior practice to reduce the variations of the light intensity was applied to a laser diode for emitting continuous wave (CW) light or direct current (DC) light. No investigation was paid up to now to the noise involved in the intensity of such pulsed light when it is generated as well as no trial to stabilize the pulsed light intensity.

On the other hand, there are many application fields in need of short pulsed light because of temporal resolution being specified by the width of pulsed light. Those fields include an electro optic sampling technique as disclosed in IEEE Journal of Quantum Electronics, Vol. QE-22, No. 1, January 1986, PP 69 through 78 in which an ultrashort optical pulse is used as a sampling gate to nondestructively measure an electric signal with use of an electro-optic (E-O) effect; a fluorescence life measuring technique as disclosed in Rev. Sci. Instrum. 59 (4), April 1988, PP 663 through 665 in which an ultrashort optical pulse is used to measure laser excited fluorescence; estimation of response characteristics of photoelectric detectors and optical integrated circuits (OE IC), etc.; time correlated photon counting using a photomultiplier, and so on, for example. A dye laser which generates a picosecond to femtosecond width pulsed light is usable for such applications from the viewpoint of temporal resolution but with a difficulty of its being large-sized. Instead of this, laser diodes are hopeful as pulsed light sources, because they have some advantages of their being simple and small-sized instructure, inexpensive in manufacture.

Now, laser diodes can generate a short pulsed light with an about 200 to 20 picosecond width, and with about 670 nm to 1.5 $\mu$m wavelengths in typical, the latter emission wavelengths being varied depending upon the kinds thereof. Additionally, a second harmonic of the pulsed light from a laser diode is available to assure a short wavelength pulsed light up to 340 nm. Repetitive frequencies of such optical pulses generally range from 0.1 to 200 MHz although being different in accordance with applications. Furthermore, there are technically available GHz high repetition pulsed light and inversely about several hundred Hz pulsed light.

The present inventors have however experimentally found that use of such a high repetition optical pulse to measurements causes intensity fluctuations of the light pulse to restrict the lower limit of a measurement range, as described below. For simplicity, there will be described a measurement of transmittance of a pulsed light through a sample 10 with use of a device illustrated in FIG. 8. In FIG. 8, a laser diode 12A (refer to FIG. 9) incorporated in a laser diode (LD) pulsed light source 12 emits the optical pulse which is controlled in its repetitive frequency by an oscillator 14 (repetitive frequency 100 MHz, pulse width 50 picosecond, and wavelength 830 nm, for example). The LD pulsed light source 12 is constructed as illustrated in FIG. 9, for example, to which a bias current has previously been supplied and on which a negative pulse is applied from an electric pulse generator 12B (Hewlett Packard, 33002A Comb-Generator (registered trademark) for example) using a step recovery diode for example to drive the LD 12A.

The pulsed light emitted from the laser diode (LD) 12A impinges upon the sample 10 through a chopper 16 (chopping frequency 1 kHz, for example) driven by the oscillator 15 and is partly absorbed by and partly transmitted through the same as an output light. The output light is focused by a lens 18 and detected by a photodetector 20 composed of a photodiode (PD) for example. An output signal from the photodetector 20 is amplified by a low noise amplifier 22 and lock-in detected by a lock-in amplifier 24. A chopper signal generated by the oscillator 15 is used for a reference signal in the lock-in amplifier 24. Herein, noises produced in the photodetector 20 and in the low noise amplifier 22 have sufficiently been more reduced than that involved in the transmitted light.

An output from the lock-in amplifier 24 is fed to an output meter 26 for example and displayed with respect to the transmittance of the foregoing output light.

Herein, although in the foregoing device of FIG. 8 was made of the chopper 16 and of the lock-in amplifier 24 for lock-in detection for the purpose of the reduction of measurement noises and the improvement of measurement accuracy, such construction is unnecessary in simple measurements, in other words, an output from the photodetector 20 may be amplified and read in a direct manner. Further, the low noise amplifier 22 may be omitted and the lock-in amplifier 24 may instead be employed.

In such a device, in case where the transmittance of the pulsed light through the sample 10 is nonlinear with respect to the incident pulsed light, the incident pulsed light must be measured up to a sufficiently low level of the intensity thereof. Thereupon, a difficulty is produced of noise involved in the pulsed light emitted from a pulsed oscillation LD, which limits the lower boundary of the measurement.

Referring to FIG. 10, exemplary noise characteristics of the LD pulsed light obtained experimentally by the present inventors are illustrated, with the horizontal axis taking frequencies and the vertical axis effective values (rms) of photoelectric current noise in decibel (dB). The point 0 dB on the vertical axis indicates a short noise level defined by the square root of the number of photons involved in the optical pulse (theoretical limit). FIG. 10 therefore indicates a noise level of the LD pulsed light normalized by the shot noise level. FIG. 10 further illustrates a noise level with the prior system as indicated by a solid line A and marks X. It is understood from the figure that the noise level when the LD undergoes pulsed oscillation is greater 10 times (20 dB) or more than the shot noise level, so that the former may be reduced to the latter shot noise level.

The data illustrated in FIG. 10 is given by measuring involved noise produced when the LD 12A to be measured is driven by a driving circuit 30 constructed as illustrated in FIG. 9 using a noise fraction measuring device composed of the photodetector 20, low noise amplifier 22, lock-in amplifier 24, an oscillator (OSC) 32 for frequency sweep, a noise detection circuit 34, and a display 36.

SUMMARY OF THE INVENTION

In view of the drawbacks with the prior art, it is an object of the present invention to provide a low noise pulsed light source using a laser diode capable of assuring high repetition pulsed light with very stable intensity and with reduced light intensity noise.

Another object of the present invention is to provide a device for measuring voltage highly accurately utilizing an electrooptic effect with use of such a low noise pulsed light source as described above.

To achieve the above object, a low noise pulsed light source utilizing a laser diode characterized in that said light source comprises a laser diode for emitting repetitive pulsed light, an electric pulse generator for driving said laser diode, a current source for supplying a bias current to said laser diode, a photodetector for detecting part of the pulsed light emitted from said laser diode, a control means for modulating at least one of the bias current from said current sources and the amplitude of a pulse signal generated from said electric pulse generator in accordance with an output signal from said photodetector over a wide frequency band such that the intensity of said pulsed light is kept unchanged and any noise superimposed on said intensity of said pulsed light is reduced; and in that a feedback system including the photodetector and the control means has a peak in its frequency characteristics within a frequency band for light detecting in a light measuring system utilizing the low noise pulsed light source.

In another aspect, a low noise pulsed light source utilizing a laser diode according to claim 1 characterized in that the light measuring system includes a lock-in-amplifier lock-in amplifying a detected signal, and the frequency band for light detecting is the lock-in-frequency of the lock-in-amplifier.

In further another aspect, the bias current from said current source is modulated and controlled in a frequency band below a predetermined frequency while the amplitude of a pulse signal generated by said electric pulse generator is modulated and controlled in a frequency band above the predetermined frequency in accordance with an output signal from said photodetector such that intensity of the pulsed light remains unchanged and any light intensity noise is reduced.

In still another aspect, said electric pulse generator incorporates a step recovery diode.

In still further another aspect, said optical detector is assembled together with a laser diode as a set in the same package.

In another aspect, the time constant of a feedback system which detect the pulsed light and controls the same is longer than the repetitive period of the pulsed light.

In further another aspect, the frequency characteristics of the feedback system has a peak to reduce involved noise in a specific frequency range, and the frequency of a reference signal of a lock-in amplifier for use in a measuring system falls within said specific frequency range.

In still another aspect, a voltage detector device of such a type as those utilizing an electrooptic material which has its refractive index varied by voltage of a predetermined portion of an object to be measured is applied and is characterized in including a first electrooptic material influenced by the voltage of a predetermined portion of the object, a second electrooptic material disposed to compensate a phase difference caused by spontaneous double refraction of said first electrooptic material, and the low noise pulsed light source a low noise pulsed light source utilizing a laser diode comprising a laser diode for emitting repetitive pulsed light, an electric pulse generator for driving said laser diode, a current source for supplying a bias current to said laser diode, a photodetector for detecting part of the pulsed light emitted from said laser diode, and a control means for modulating at least one of the bias current from said current sources and the amplitude of a pulse signal generated from said electric pulse generator in accordance with an output signal from said photodetector over a wide frequency band such that the intensity of said pulsed light is kept unchanged and any noise superimposed on said intensity of said pulsed light is reduced, said second electrooptic material being formed with the same material as said first electrooptic material and having the same length as that of said first electrooptic material in the direction of in optical axis, and being further aligned along the optical axis, and pulsed light from said low noise pulsed light source being directed to enter said first and second electrooptic materials along the optical axis.

In still further another aspect, said second electrooptic material is disposed in its optical crystal axis to be perpendicular to the optical crystal axis of said first electrooptic material.

In another aspect, said second electrooptic material is disposed in its optical crystal axis to be parallel to the optical crystal axis of said first electrooptic material, and means is provided between said first and second electrooptic materials for rotating by 90° the polarization component of the light.

In further another aspect, the device is further provided with a first transparent electrode provided between said first and second electrooptic materials, and a second transparent electrode provided oppositely to the side where said first transparent electrode of said second electrooptic material.

In still further another aspect, said first transparent electrode is kept at ground potential, and voltage is applied to said second transparent electrode to output light from the same, said light is such that produced by removing a DC component from the polarization state of exit light from said second electrooptic material.

In another aspect, a voltage detector of such a type a those utilizing an electrooptic material which has its refractive index changed by voltage of a predetermined portion of an object to be measured is applied, in which said electrooptic material is positioned at a predetermined location in an optical probe, which material includes at the tip end thereof reflecting means for reflecting an optical beam incident along the center axis of said optical probe and further includes a transparent electrode oppositely to the side where said reflecting means of the electrooptic material is provided, and said optical beam is pulsed light emitted from a low noise pulsed light source utilizing a laser diode comprising a laser diode for emitting repetitive pulsed light, an electric pulse generator for driving said laser diode, a current source for supplying a bias current to said laser diode, a photodetector for detecting part of the pulsed light emitted from said laser diode, and a control means for modulating at least one of the bias current from said current sources and the amplitude of a pulse signal generated from said electric pulse generator in accordance with an output signal from said photodetector over a wide frequency band such that the intensity of said pulsed light is kept unchanged and any noise superimposed on said intensity of said pulsed light is reduced.

In further another aspect, said transparent electrode is set in its surface to be perpendicular to the center axis of said optical probe.

In still another aspect, a voltage detector of such a type as those utilizing an electrooptic material which has its refractive index changed by applying voltage of a predetermined portion of an object to be measured, in which said detector includes a low noise pulsed light source utilizing a laser diode comprising a laser diode for emitting repetitive pulsed light, an electric pulse generator for driving said laser diode, a current source for supplying a bias current to said laser diode, a photodetector for detecting part of the pulsed light emitted from said laser diode, and a control means for modulating at least one of the bias current from said current sources and the amplitude of a pulse signal generated from said electric pulse generator in accordance with an output signal from said photodetector over a wide frequency band such that the intensity of said pulsed light is kept unchanged and any noise superimposed on said intensity of said pulsed light is reduced, said electrooptic material being positioned to cover therewith a plurality of measurement positions of the object from which voltage is to be detected, the pulsed light from said low noise pulsed light source being incident on respective portions of the electrooptic material corresponding to the plurality of the measurement positions of the object to scan therewith the respective portions of the electrooptic material, whereby voltages of the object at the plurality of the measurement positions on the basis of changes in the polarization states of emanating lights from said respective portions of the electrooptic material.

In still further another aspect, each of incident lights, which are yielded by dividing the optical beam from the low noise pulsed light source to many desired patterns, enters each of specific portions of said electrooptic material corresponding to specific portions of the object.

In another aspect, an optical beam emanating from the light source is divided to many incident lights of each of grid-shaped patterns through a micro-lens array.

In further another aspect, said electrooptic material being positioned so as to cover therewith a plurality of two-dimensional positions of an object from which voltage is to be detected, the optical beam from said low noise pulsed light source entering uniformly parallelly the respective two-dimensional portions of said electrooptic material corresponding to the plurality of the two-dimensional positions of the object, changes in polarization states of exit lights from the plurality of the two-dimensional portions of said electrooptic material being detected by detectors.

In still another aspect, said electrooptic material being positioned so as to cover therewith a plurality of two-dimensional positions of an object from which voltage is to be detected, an optical beam with a short pulse duration from said low noise pulsed light source entering uniformly parallelly respective two-dimensional portions of said electrooptic material corresponding to the plurality of the two-dimensional positions of the object, changes polarization states of exit lights from the plurality of the two-dimensional portions of said electrooptic material being detected by detectors, and in which said voltage detector further includes an observation light source for outputting an optical beam with a wavelength different from that from said low noise pulsed light source, said optical beam being used for observation of the wiring arrangement of the object, switching means for switching the optical beams from said observation light source and from said low noise pulsed light to direct the switched optical beam to said electrooptic material, phase compensator means for adjusting, upon observation of the wiring arrangement of the object, the phase of exit light different from that upon detecting the change in said polarization state, display means for displaying thereon the voltages at the two-dimensional positions on the object measured on the basis of the changes in the polarization states of said exit lights, superimposed on with the wiring arrangement of the object observed by said detectors, and variable delay means for shifting incident timing of the optical beam from said low noise pulsed light source onto the electrooptic material to sampling and measuring the voltage change at the two-dimensional position on the object.

FIG. 1 illustrates an example of the basic construction of the first invention.

A laser diode (LD) 38 is first brought to pulsed oscillation by previously supplying a bias current thereto and applying a short pulse electric signal thereto from an electric pulse generator 40 through a capacitor $C_1$. A photodetector 42 such as a photodiode (PD) detects splitted light of the LD light or light emanating from the other end of the LD 38. An output from the photodetector 42, which is proportional to the intensity of the LD light is amplified and is used to permit a stabilized current modulator circuit 44 to modulate the bias current of the LD 38 over a wide frequency band and control the bias current such that the intensity of the LD light remains unchanged and any noise superimposed on the intensity of the pulsed light is reduced. Herein, the time constant of the feedback system is set to be sufficiently longer than the repetitive period of the LD pulsed light. Hereby, the intensity of the LD pulsed light is automatically controlled to remain unchanged, and any noise involved in the LD light is also reduced as indicated by the broken line B and the marks $\Delta$ in FIG. 9.

The foregoing stabilized current modulator circuit 44 is to compare the output from the optical detector 42 and a level signal, and includes, as shown in FIG. 2, a light intensity signal comparator circuit 44A for making constant a DC component such as a temperature change and temporal drift etc., involved in the light intensity, a light intensity noise extraction circuit 44B for extracting light intensity noise from an output signal of the optical detector 42 to stabilize an AC component such as a ripple that changes at light speed, and a stabilized current modulator circuit 44C for modulating a current on the basis of output signals from the light intensity signal comparator circuit 44A and the light intensity noise extraction circuit 44B.

Herein, although in the basic construction illustrated in FIG. 1 the bias current supplied to the LD 38 was modulated by the stabilized current modulator circuit 44 over a wide frequency range in accordance with an output signal from the photodetector 42, the construction to make constant the intensity of the LD pulsed light is not limited thereto. For example, the electric pulse generator 40 may be replaced by the photodetector 42 and a stabilized electric pulse generator 41 as illustrated in FIG. 5, and the amplitude of a pulse signal generated by the stabilized electric pulse generator 41 may be modulates in accordance with an output signal from the photodetector 42. Additionally, both may be combined such that the bias current is modulated by the stabilized current modulator circuit 44 in a frequency region below a predetermined frequency while the amplitude of a pulse signal generated by the stabilized electric pulse generator 41 is modulated in a frequency range above the predetermined frequency.

With such construction, it is possible to stabilize the intensity of high repetition pulsed light and reduce the light intensity noise. An optical pulse generated by such the above LD is therefore usable for varieties of measuring fields such for example as E-O sampling, fluorescence lifetime measurement, estimation of response characteristics of photoelectric detector, OE ICs and the like, and temporal correlation photon counting. The above optical pulse improves the accuracy of those measurements and of the extension of the lower limits of the measurements, especially, is much effective by applying to a voltage detector.

In accordance with the invention as set forth in claims 8 through 10, there is provided the second electrooptic material, additionally to the first electrooptic material influenced by the voltage of a predetermined portion of an object to be measured, e.g., an integrated circuit, the second electrooptic material being disposed to compensate a phase difference caused by spontaneous double refraction of the first electrooptic material. With such arrangement, once a light with a given polarization component enters the second electrooptic material, for example, the polarization state of the light is changed through the second electrooptic material owing to the phase difference by the spontaneous double refraction. Then, as the same light enters the first electrooptic material, the polarization state of the light is changed through the first electrooptic material oppositely to the case of the second electrooptic material owing to the phase difference by the spontaneous double refraction of the first electrooptic material, and further changed owing to the voltage of the predetermined portion of the object. Hereby, the changes in the polarization states caused by the phase differences of the spontaneous double refraction of the first and second electrooptic materials are cancelled each other, resulting in the polarization state of the incident light being changed only by the voltage of the predetermined portion of the object.

In the invention as set forth in claims 11 and 12, the first transparent electrode is interposed between the first and second electrooptic materials and is kept at earth potential for example. A second transparent electrode is disposed on the side of the second electrooptic material located oppositely to the side where the first transparent electrode of the second electrooptic material has been provided, to which electrode predetermined variable voltage for example is applied. With such arrangement, the second electrooptic material compensates the influence of the phase change of the incident light due to the spontaneous double refraction in the first electrooptic material at all times. Simultaneously, a DC component of the polarization state of the exit light from the first electrooptic material is eliminated by applying voltage to the second transparent electrode, and further the polarization state of the exit light from which the DC component has been eliminated, is compensated so as not to vary owing to a temperature change by making variable the voltage applied to the second transparent electrode following the temperature change.

In the invention as set forth in claims 13 and 14, there is provided reflecting means such as a metal thin film, a dielectric multi-layer film mirror, and the like for example on the tip end of the electrooptic material, while there is provided the transparent electrode oppositely to the electrooptic material to the side of the same where said reflecting means has been provided. Provided that the surface of the transparent electrode is set to be perpendicular to the central axis of the optical probe for example and that the transparent electrode is kept at earth potential for example, and electric line of force produced by the voltage of the predetermined portion of the object is brought into a parallel one in the electrooptic material with respect to the central axis of the optical probe. Hereby, the change in the refractive index of the electrooptic material is made uniform over the whole electrooptic material, so that the polarization state of the optical beam can be changed accurately corresponding to the voltage of the predetermined portion of the object.

In the invention as set forth in claim 15, the electrooptic material is positioned so as to cover a plurality of measurement positions on an object from which voltages are to be detected, and an optical beam is directed to enter respective portions of the electrooptic material corresponding to the plurality of the measurement positions of the object for scanning over these respective portions. For the scanning, the optical beam may be deflected with the aid of a movable mirror, an acoustooptic deflector, and the like for example, or it may be realized by moving the electrooptic material and the object. On the basis of changes in the polarization states of exit lights from the respective portions of the electrooptic material due to such scanning, voltages at the plurality of the measurement positions of the object can be detected with good operatability.

In the invention as set forth in claim 16, the electrooptic material is positioned so as to cover a plurality of positions of an object, form which voltages are to be detected, and an optical beam from a light source is divided into many desired patterns by a microlens array, a holographic lens, or a spatial light modulator and directed to enter particular portions of the electrooptic material corresponding to the particular positions of the object. Refractive indexes of the respective portions of the electrooptic material are changed by the voltage at the respective positions of the object corresponding to the respective portions of the electrooptic material, so that the optical beam divided into many desired patterns and directed to enter the respective particular portions of the electrooptic material is changed in polarization states in conformity with the changes in the refractive indexes at the respective particular portions of the electrooptic material and emanating from the electrooptic material as an exit light to enter a detector, say, a two-dimensional photodetector array or a streak camera. Hereby, the detector can detect the voltages at particular positions of the object, for example, the particular two-dimensional positions, simultaneously.

In the invention as set forth in claim 18, the electrooptic material is positioned so as to cover a plurality of two-dimensional positions of an object, from which voltages are to be detected, and an optical beam from the light source is directed to enter respective two-dimensional portions of the electrooptic material corresponding to the plurality of the two-dimensional positions of the object. Refractive indexes of the respective two-dimensional portions of the electrooptic material are changed owing the voltages at the respective two-dimensional positions of the object corresponding to the respective two-dimensional portions of the electrooptic material, so that the optical beam incident upon the respective two-dimensional portions of the electrooptic material is changed in its polarization states following the changes in the refractive indexes of the respective two-dimensional portions of the electrooptic material, emanating as exit light from the electrooptic material and directed to enter a detector, say, a two-dimensional photodetector array or a streak camera. Hereby, the detector can detect the voltages at the two-dimensional positions on the object, simultaneously.

In the invention as set forth in claim 19, voltage distribution at the two-dimensional positions on the object is displayed together with the wiring configuration of the object superimposed on the former distribution. More specifically, the optical beam from the observation light source is first switched by the switching means to enter the electrooptic material for observation of the wiring configuration of the object, and the exit light is adjusted in its phase for observation by the phase compensator means. With such switching and adjustment, the optical beam from the observation light source enters the electrooptic material as parallel light and further enters the surface of the object after passing through the electrooptic material. Herein, there is provided the dielectric multi-layered film mirror on the bottom surface of the electrooptic material, which mirror is to transmit the optical beam from the observation light source therethrough but reflect the optical beam from the voltage detection light source thereon. The optical beam from the observation light source incident upon the surface of the object is partly reflected on the surface of the object is partly reflected on the surface of the object following the wiring configuration of the same to emanate from the electrooptic material as exit light. The exit light emanating from the electrooptic material is directed to enter a two-dimensional detector through the phase compensator means and is detected by the detector as visual image data of the wiring configuration of the object. After the visual image data of the wiring configuration is detected as such, the optical beam from the pulsed light source is switched by switching means to enter the electrooptic material for detecting the voltage at the two-dimensional positions of the object, and the exit light is adjusted in its phase for voltage detection by the phase compensator means. Herein, operation of the object is needed to be synchronized with the pulsed light. With such switching and adjustment, the voltages at the two-dimensional positions of the object in one-sampling timing are detected by the detector in the same manner as the invention as set forth in claim 18. Successively, the display means displays the visual image data of the wiring configuration of the object detected by the detector on a display and the like together with the voltage distribution of the object in the one sampling timing superimposed on said visual image data. Further, the optical beam from the pulsed light source is slightly delayed through the variable delay means, whereby the voltages at the two-dimensional positions of the object are detected in a timing slightly shifted from the previous sampling timing and displayed on the display means. Hereby, a temporal change in the voltage distribution at the two-dimensional positions of the object can be observed visually on the display screen together with the wiring configuration of the object superimposed on the foregoing temporal change.

BRIEF DESCRIPTION OF THE DRAWINGS

The exact nature of this invention, as well as other objects and advantages thereof will be readily apparent from consideration of the following specification relating to the accompanying drawings, in which like reference characters designated the same or similar parts throughout the figures thereof and wherein.

DESCRIPTION OF THE PREFERRED EMBODIMENTS

In that follows, embodiments of the present invention will be described with reference to the accompanying drawings.

Figure 1:
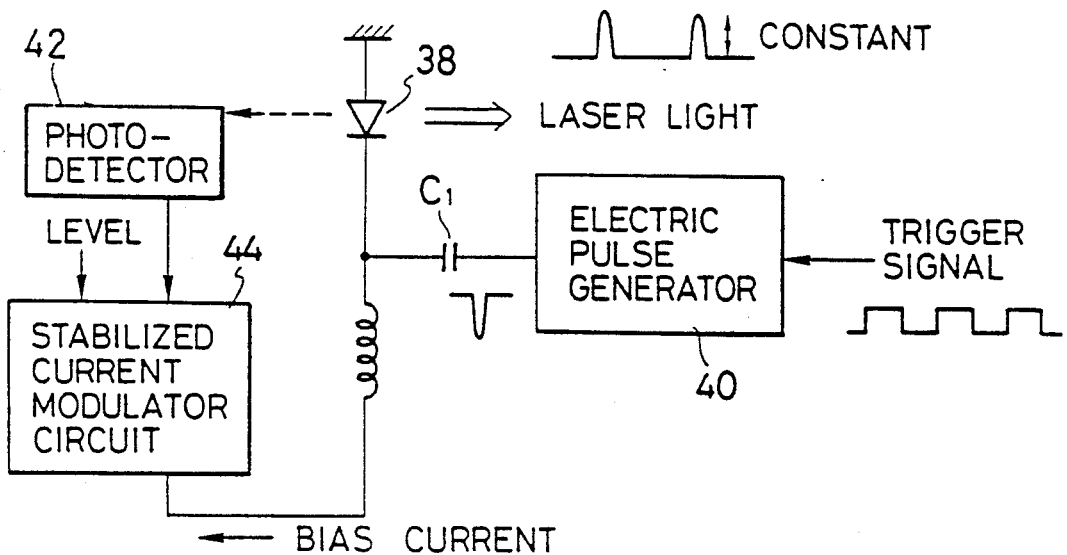
FIG. 1 is a block diagram exemplarily illustrating the basic construction of a low noise pulsed light source utilizing a laser diode (LD) according to the present invention.
Figure 2:
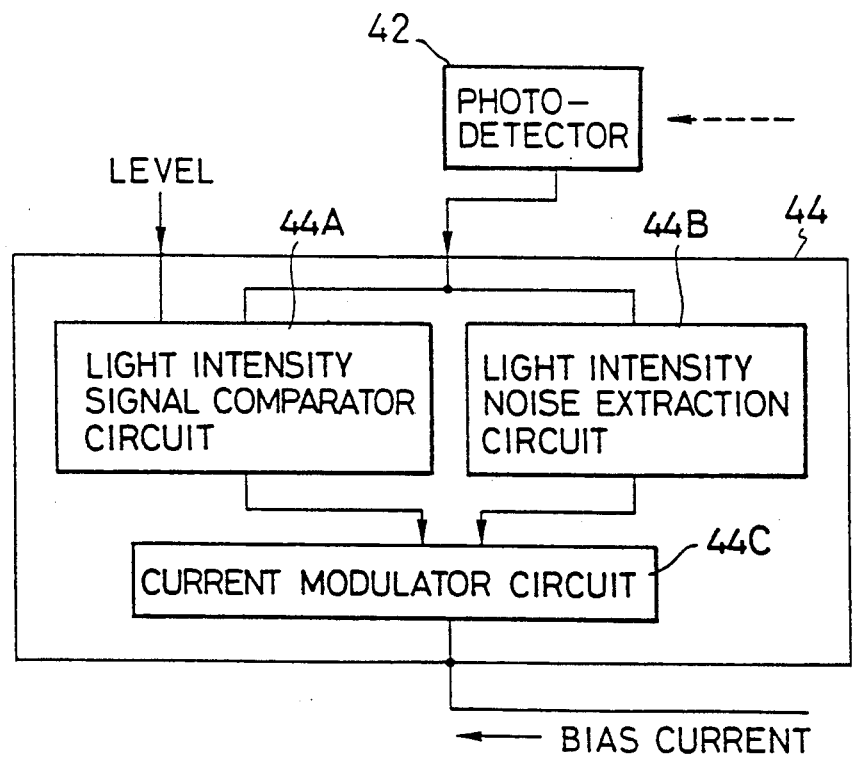
FIG. 2 is a block diagram illustrating a stabilized current modulator circuit in the above basic construction.
Figure 3:
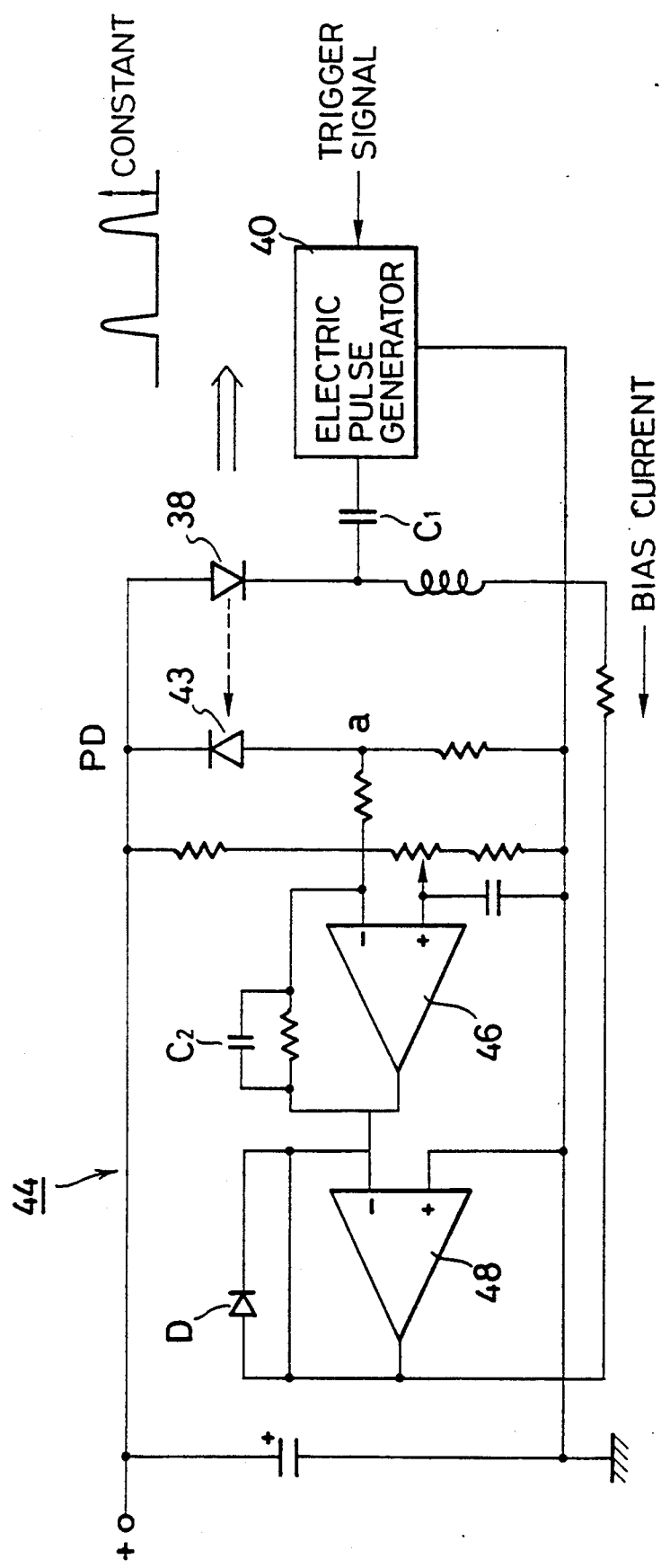
FIG. 3 is a circuit diagram illustrating the construction of a first embodiment of the present invention.

A first embodiment of the present invention embodies the basic construction illustrated in FIG. 1 and principally comprises, as illustrated in FIG. 3, a reverse-biassed pin photodiode (PIN-PD) 43 for detecting part of emitted light from the LD 38, and a stabilized current modulator circuit 44 composed of a first amplifier 46 for inversely amplifying a photoelectric current signal yielded by the PIN-PD 43 to alter the DC level of an output signal and of a second amplifier 48 as an inverted current amplifier for inverting and amplifying the output of the first amplifier 46.

The first amplifier 46 has a feedback loop that incorporates a capacitor $C_2$ for making longer the time constant of the first amplifier 46 than the repetitive period of the pulsed light.

Additionally, the second amplifier 48 has a feedback loop that incorporates a diode D for making zero the minimum of the bias current to prevent an opposite bias current from flowing.

Other features are identical to those in the basic construction illustrated in FIG. 1 and the description thereof will be omitted.

Operation of the first embodiment is as follows.

As the intensity of pulsed light from the LD 38 is increased, for example, a photoelectric current from the PIN-PD 43 is increased to raise the potential at the point a in the figure. Hereby, the output voltage of the first amplifier 46 is decreased, and hence the output current of the second amplifier 48 (the direction of the arrow in the figure is assumed to be positive) or the bias current is decreased. Therefore, the intensity of the output light from the LD 38 is reduced and controlled such that it remains unchanged.

Figure 4:
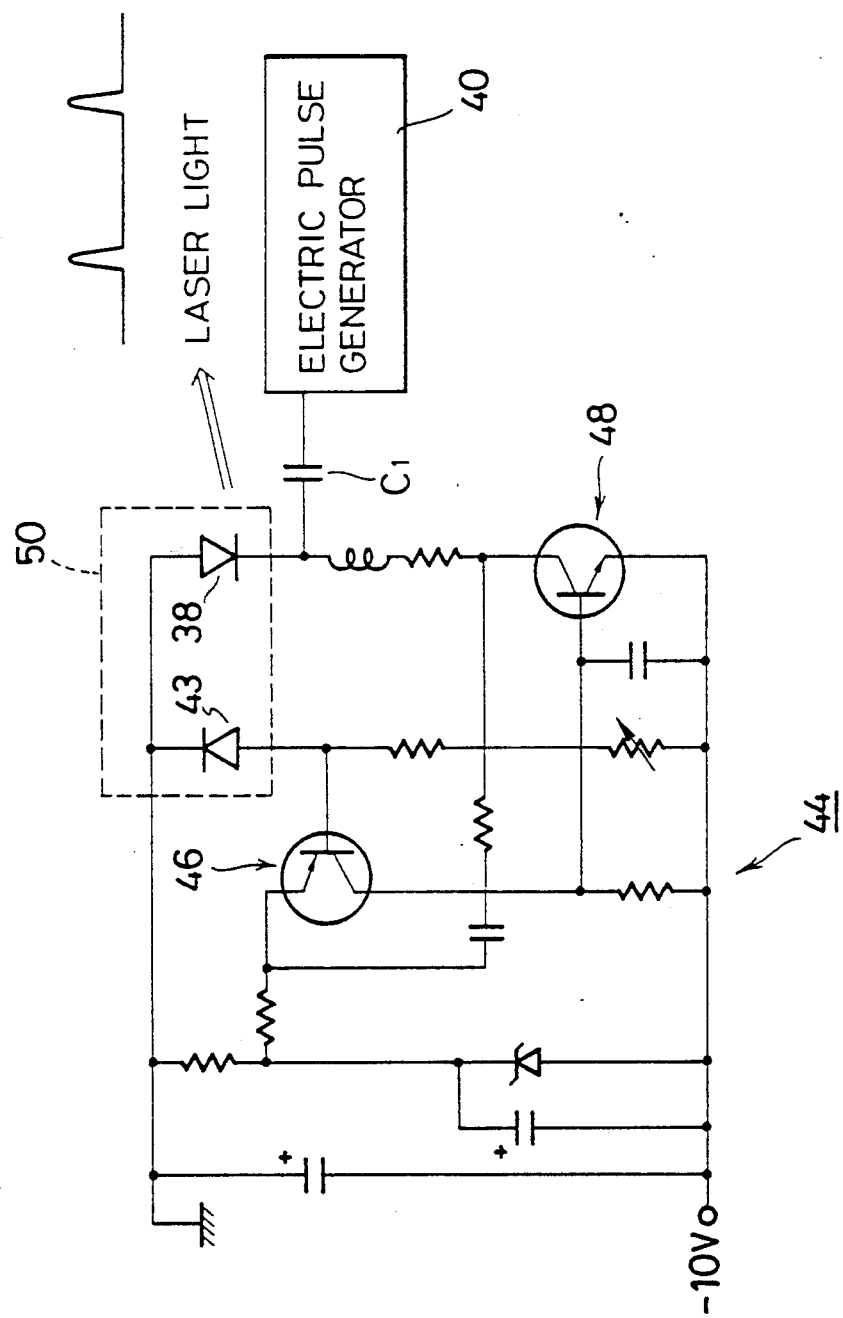
FIG. 4 is a circuit block diagram exemplarily illustrating the concrete construction of the first embodiment of the present invention.

Referring to FIG. 4, the concrete construction of the first embodiment is exemplarily illustrated. In the present example, the amplifiers 46, 48 comprise transistors, capacitors, and resistors, etc., respectively. Further, a set of the LD 38 and the PIN-PD 38 is housed in the same package 50, for miniaturization thereof.

Figure 5:
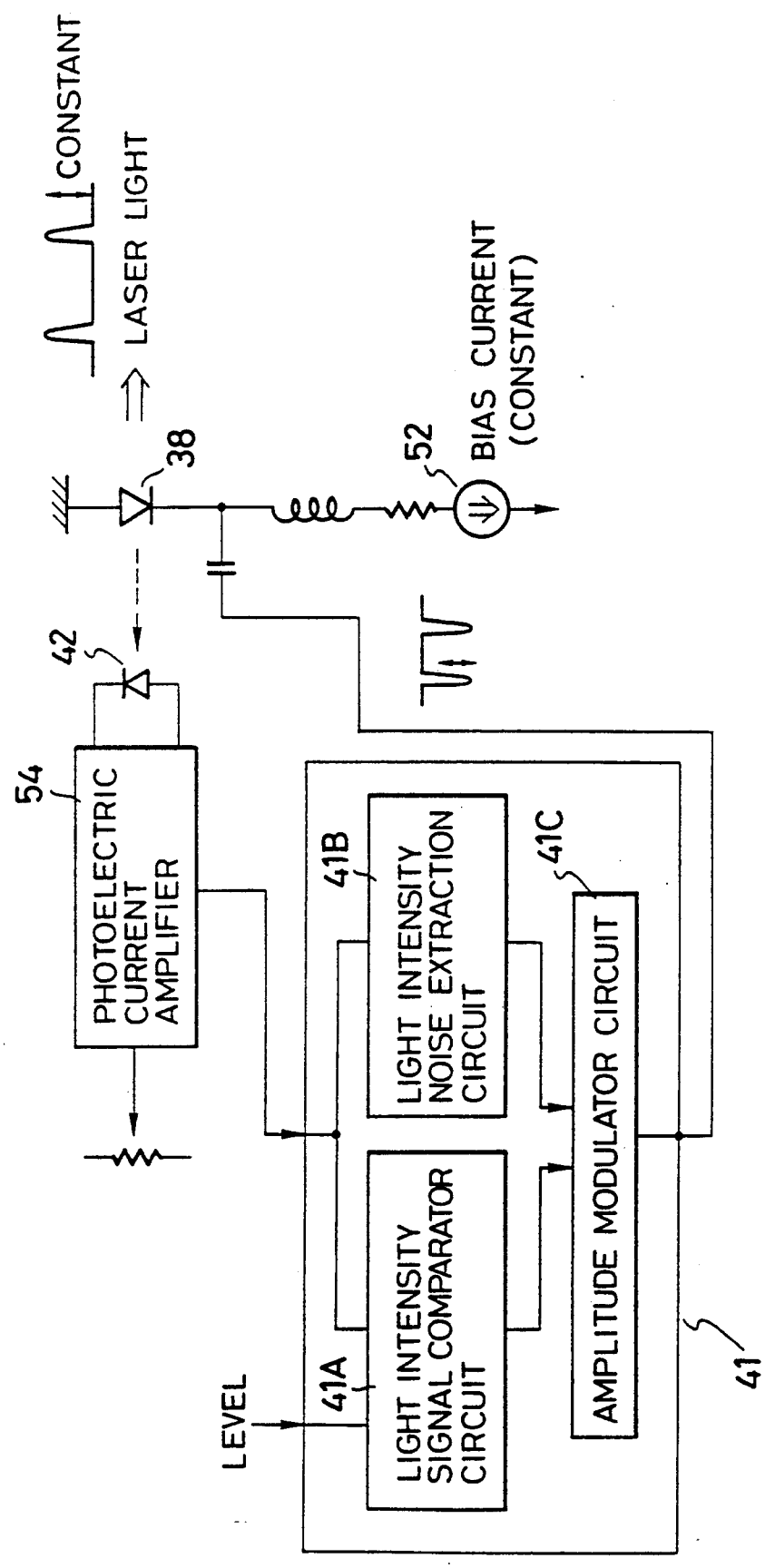
FIG. 5 is a block diagram illustrating the construction of a second embodiment of the present invention.

In succession, a second embodiment of the present invention will be described with reference to FIG. 5.

In the second embodiment, a direct current (DC) bias current supplied from a current source 52 to the LD 38 is made constant, while a signal detected by the photodetector 42 is amplified by a photoelectric current amplifier 54 and adapted to modulate the amplitude of a pulse voltage applied from the stabilized electric pulse generator 41, that is controllable in amplitude over a wide frequency range, to the LD 38.

The stabilized electric pulse generator 41 comprises a light intensity signal comparator circuit 41A for comparing a signal from the amplifier 54 with a level signal to make constant a DC component such as a temperature change and temporal drift, etc., involved in the intensity of the LD pulsed light, a light intensity noise extraction circuit 41B for stabilizing AC components, that change at high speed, such as ripples, etc., and an amplitude modulator circuit 41C for modulating the amplitude of an output pulse voltage on the basis of a signal which has been made constant in DC components thereof by the just-mentioned circuits and from which involved noise has been removed.

More specifically, when the intensity of the LD pulsed light is strong, the amplitude of the pulsed voltage is controlled such that it is reduced. Hereby, the intensity of the LD pulsed light is kept unchanged and any involved noise is reduced.

Herein, although in the first and second embodiments any one of the amplitudes of the DC bias current and the pulse voltage was modulated, both may be done simultaneously, as disclosed in a third embodiment. In the third embodiment, it is effective to separate the modulation frequency regions of the two modulation systems. For example, a frequency range of from DC to 1 kHz may be controlled by the DC bias current while a frequency range above 1 kHz may be controlled by the amplitude of the pulse voltage.

Successively, a fourth embodiment of the present invention will be described.

Figure 6:
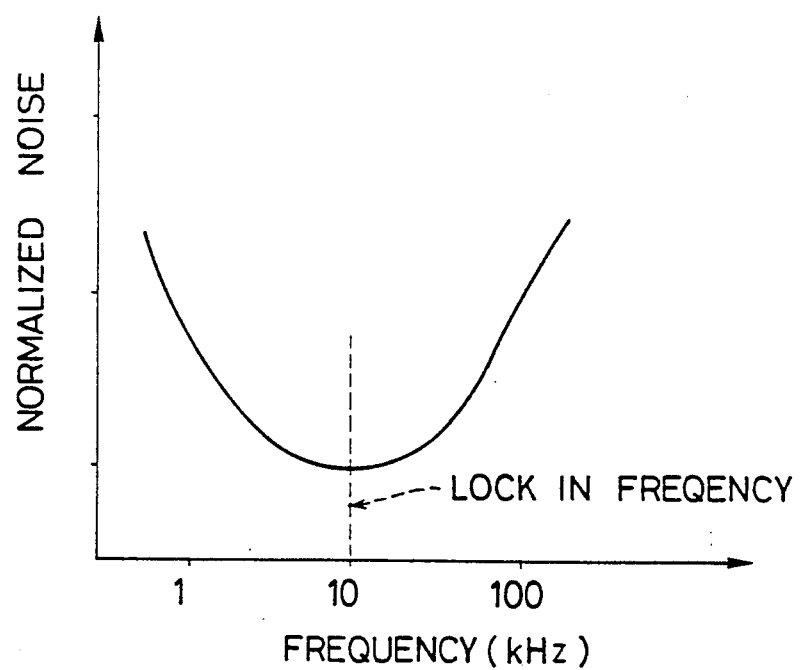
FIG. 6 is a block diagram illustrating the principle of a fourth embodiment of the present invention.

In the fourth embodiment, frequency characteristics are provided to the feedback system (optical detection-→amplification-→control) described in the first and second embodiments, and in normalized noise obtained in such a manner and illustrated in FIG. 6 a lock-in amplifier in a measuring system is locked at a frequency where less noise is involved.

Figure 7:
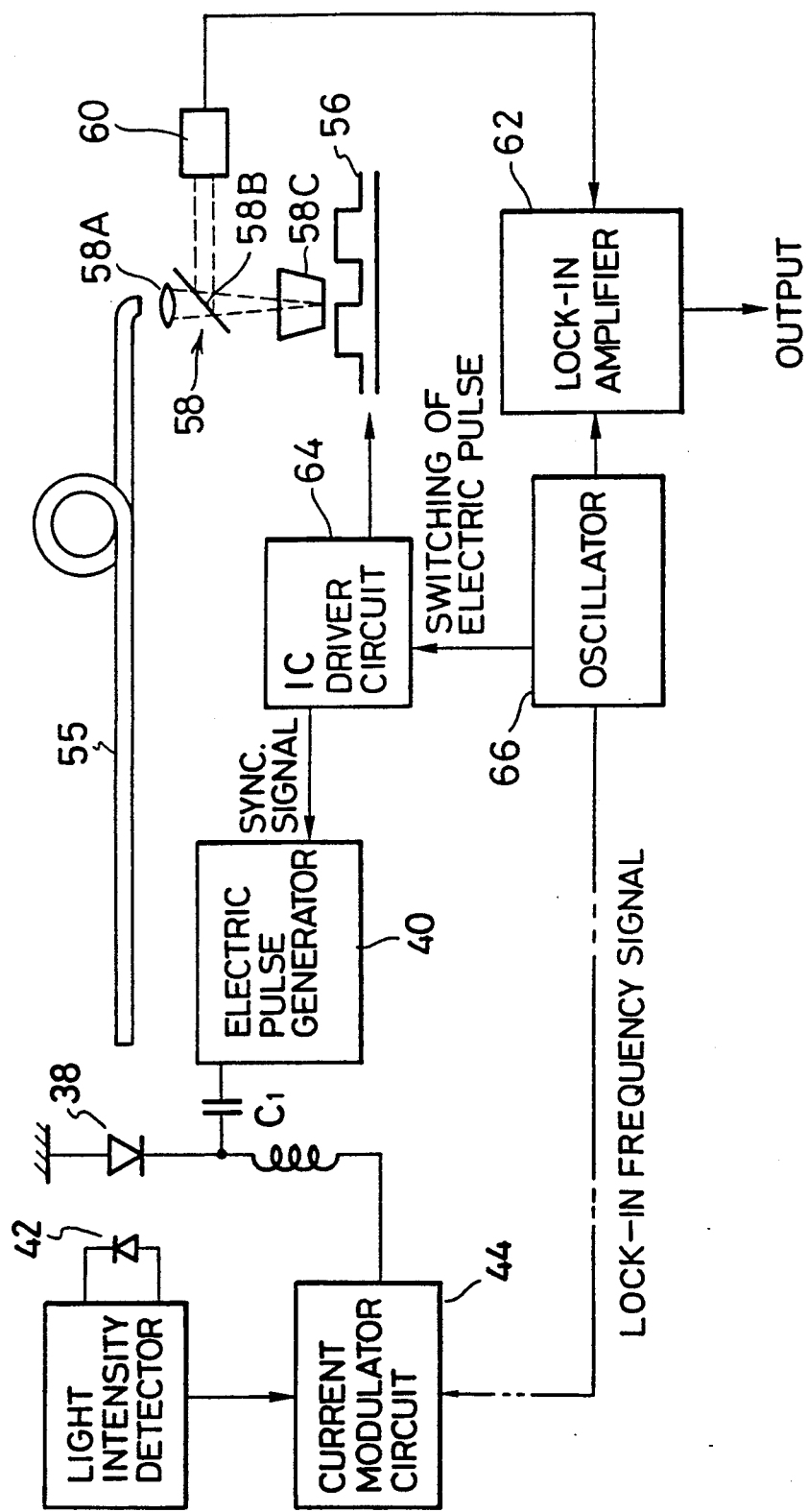
FIG. 7 is a block diagram exemplarily illustrating the construction of an E-O sampling device with use of the fourth embodiment.
Figure 8:
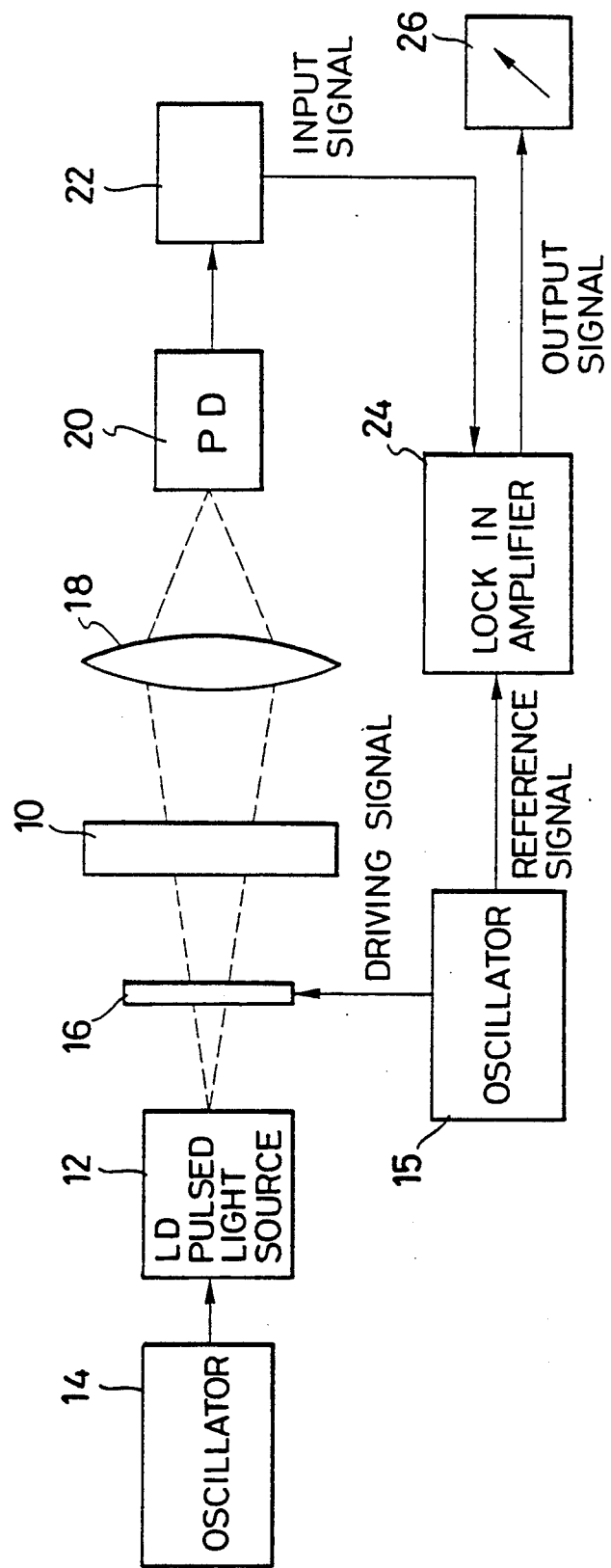
FIG. 8 is a block diagram exemplarily illustrating the construction of a transmittance measuring device intended to describe the difficulties of the prior art.
Figure 9:
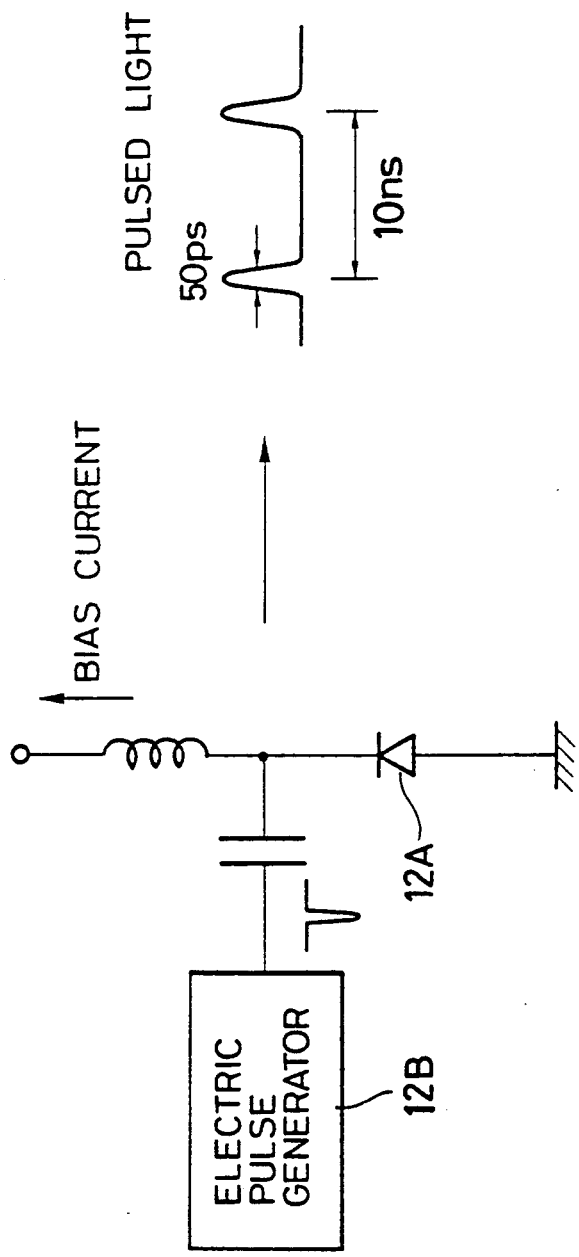
FIG. 9 is a block diagram exemplarily illustrating the construction of an LD pulsed light source used in the device of FIG. 8.
Figure 10:
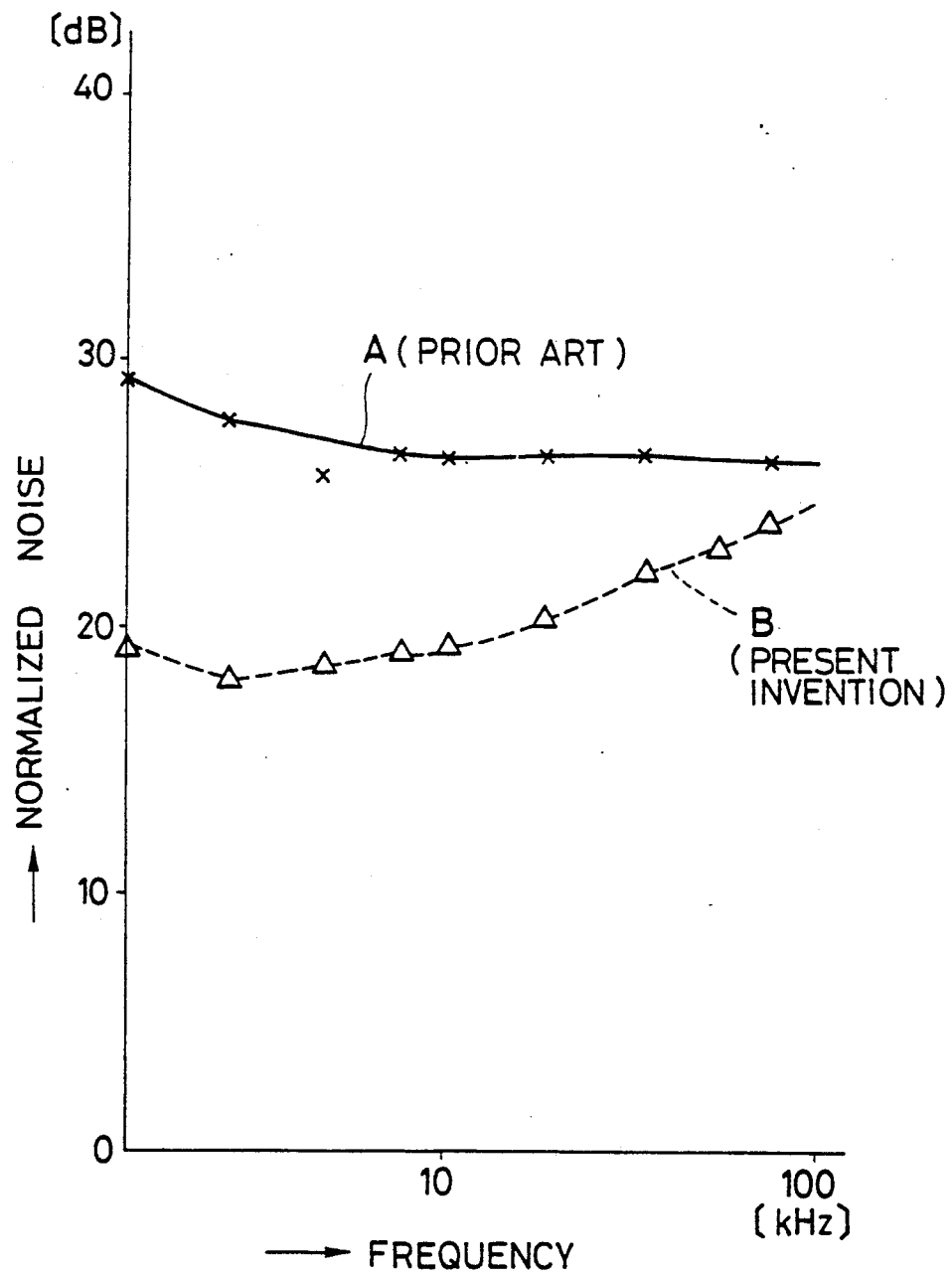
FIG. 10 is a diagram illustrating the comparison between frequency characteristics of noise levels of LD pulsed lights in the prior art and the embodiment of the present invention.
Figure 11:
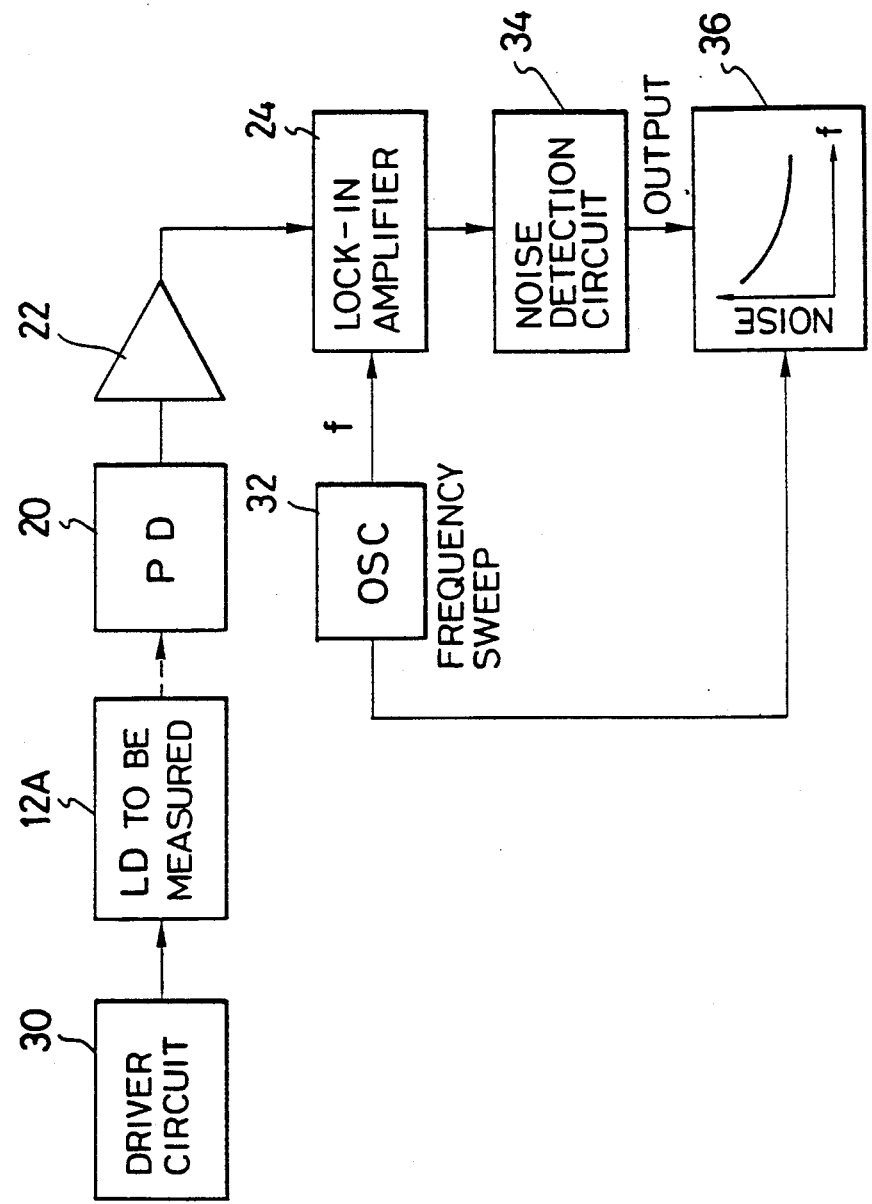
FIG. 11 is a block diagram exemplarily illustrating a noise component measuring device used for obtaining the data in FIG. 10.

To be concrete, FIG. 7 exemplarily illustrates the construction of the fourth embodiment applied to non-destructive E-O sampling for example. In this construction example, laser light emitted from the LD 38 (pulsed light for sampling) is fed to an optical probe 58 disposed upwardly of an IC 56 to be measured through an optical fiber 55 for example. The optical probe 58 comprises a lens 58A, a half mirror 58B and an electrooptic crystal 58C, and is adapted to modulate the pulsed light for sampling by making use of a change in the refractive index of the electrooptic crystal 58C caused by an electric field induced on the surface of the IC 56 by a current flowing through the same. The pulsed light modulated by the change in the refractive index is detected by the photodetector 60 and outputted through the lock-in amplifier 62. The lock-in amplifier 62 and an IC driver circuit 64, which switches an electric circuit on and off at a lock-in frequency, are controlled by an output from an oscillator 66 for switching an electric pulse on and off and outputs a synchronizing signal to the electric pulse generator 40.

Such construction assures noise detection. Additionally, although it is generally difficult to assure noise detection over a wide frequency range, it is possible to realize low noise detection of the whole measuring system by reducing involved noise at a specific frequency.

Further, as shown in FIG. 7 by two dotts line, it is possible to realize more low noise detection by inputting the signal of the lock-in frequency to the light intensity noise extraction circuit 44B (or 41B) of the stabilized current modulator circuit (or the stabilized electric pulse generator 41) from the oscillator 66 and by setting the feedback system including the light intensity noise extraction circuit 41B to have a peak in its frequency characteristics within the lock-in frequency.

Herein, although in the foregoing embodiments the present invention were applied to the E-O sampling, the scope of the present invention is not limited thereto, and may clearly be applied also to fluorescence lifetime measurement for measuring laser-excited fluorescence, estimation of response characteristics of a photoelectric detector and an OE IC, etc., and time correlated photon counting method using a photomultiplier, and so on.

In the following, an embodiment of the voltage detector device using the low noise pulsed light source will be described with reference to the drawings.

Figure 12:
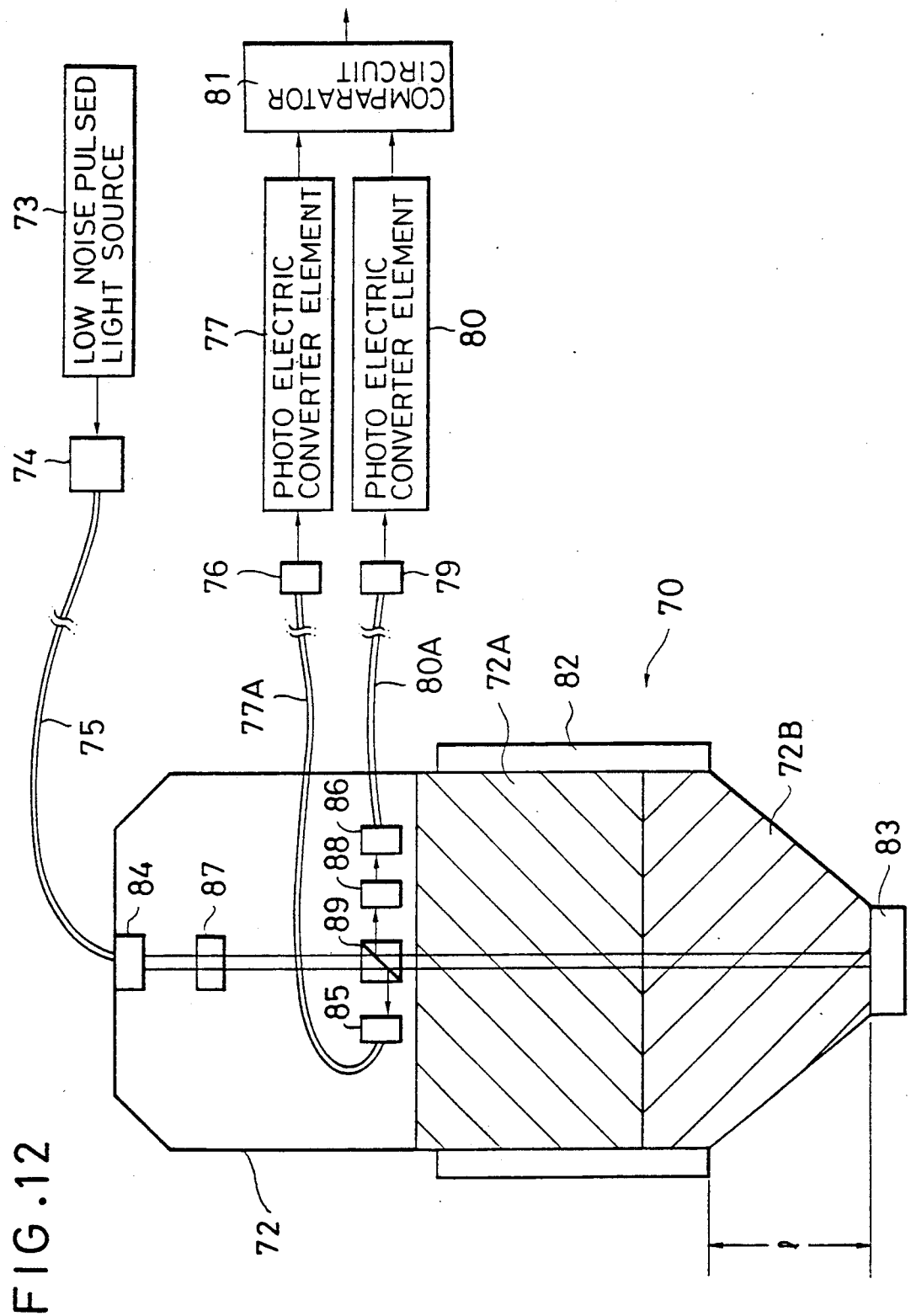
FIG. 12 is a sectional view partly in a block diagram illustrating the first embodiment of the voltage detector device according to the present invention.

FIG. 12 is a sectional view, partly including blocks, illustrating the embodiment of the voltage detector device of the type of detecting voltage of an object utilizing a fact that the polarization state of an optical beam is changed owing to voltage at a predetermined portion of the object.

In FIG. 12, the voltage detector device 70 comprises an optical probe 72, the same low noise pulsed light source 73 as that illustrated in FIGS. 1 through 5, an optical fiber 75 focusing the optical beam emitted from the low noise pulsed light source 73 and quiding the same to the optical probe 72 through a focusing lens 74, an optical fiber 77A for guiding reference light from the optical probe 72 to a photoelectric converter element 77 through a collimator 76, an optical fiber 80A for guiding exit light from the optical probe 72 to a photoelectric converter element 80 through a collimator 79, and a comparator circuit 81 for comparing electric signals subject to the photoelectric conversion from the photoelectric converter elements 77, 80.

There is disposed in said optical probe 72 two electrooptic materials 72A, 72B each comprising optically uniaxial crystal lithium tantalate ($LiTaO_3$). Those electrooptic materials 72A, 72B comprise quite the same material (optically uniaxial crystal) with their length in the directions of the optical probe's axis being made equal to each other but with the optical crystal axes of the electrooptic materials 72A, 72B being directed to be perpendicular to each other.

A conductive electrode 82 is provided on parts of the outer circumferential portions of the electrooptic materials 72A and 72B, and the tip end of the electrooptic material 72B is coated with a reflecting mirror 83 composed of a metal thin film or a dielectric multi-layer film.

In the optical probe 72 there are further provided a collimator 84, focusing lenses 85, 86, a polarizer 87 for extrating only an optical beam with a predetermined polarized component from an optical beam emanating from the collimator 84, and a beam splitter 89 for dividing the optical beam with the predetermined polarized component from the polarizer 87 to reference light and incident light and for directing the exit light from the electrooptic material 72A to an analyzer 88. Herein, the reference light and the exit light are guided into the optical fibers 77A, 80A through the focusing lenses 85, 86, respectively.

Additionally, the conductive electrode 82 is kept at the earth potential. Hereby, no electric field is therefore existent in the electrooptic material 72A, so that the refractive index of the electrooptic material 72A is not changed owing to the voltage at the predetermined portion of the object. Thus, the polarization state of the optical beam propagating in the electrooptic material 72A is varied only owing to the phase difference caused by the spontaneous double refraction of the electrooptic material 72A.

Alternatively, in the electrooptic material 72B the refractive index is varied by a potential difference between a potential induced on the reflecting mirror 83 owing to voltage on the predetermined portion of the workpiece and the earth potential of the conductive electrode 82. Accordingly, the polarization state of the optical beam propagating in the electrooptic material 72B is varied in accordance with the voltage of the predetermined portion of the object and with the phase difference caused by the spontaneous double refraction of the electrooptic material 72B.

Herein, it should be noticed that since the optical crystal axes of the electrooptic materials 72A and 72B are perpendicular to each other as described previously, the change in the polarization state of the optical beam in the electrooptic material 72A caused by the spontaneous double refraction and that in the polarization state of the optical beam in the electrooptic material 72B caused by the spontaneous double refraction are opposed to each other.

In the voltage detector device 70 with such construction, the optical beam of a predetermined polarized component emanating from the polarizer 87 enters the electrooptic material 72A as incident light through the beam splitter 89. The incident 72A is changed in its polarization state owing to the phase difference due to the spontaneous double refraction, and enters the electrooptic material 72A. Herein, both electrooptic materials 72A and 72B have their lengths in the directions of the optical probe's axis equal to each other, so that the incident light on the electrooptic material 72B is altered in its polarization state oppositely to a case where it enters the electrooptic material 72A, owing to the phase difference due to the spontaneous double refraction of the electrooptic material 72B, and further altered in its polarization state owing to the change in the refractive index based on the potential of the reflecting mirror 83. At the time the incident light reaches the reflecting mirror 83, the polarization state of the incident light is therefore changed corresponding to the change in the refractive index of the electrooptic material 72B based upon the voltage of the predetermined portion of the object, and hence eliminates the influence of the phase difference caused by the spontaneous double refraction.

Likewise, also when the incident light is reflected on the reflecting mirror 83 and returned back as exit light to the electrooptic materials 72B and 72A, the change in the polarization state of the exit light caused by the phase difference due to the spontaneous double refraction is compensated, and the polarization state of the exit light is further changed correspondingly to the change in the refractive index of the electrooptic material 72B based upon the voltage of the object. Thus, the polarization state of the exit light incident on the polarizer 88 is changed from that of the incident light splitted by the beam splitter 89, the change including no influence of the phase difference caused by the spontaneous double refraction of the electrooptic material.

In the voltage detector device 70 so arranged, the tip end of the optical probe 72 is approached to the object, e.g., an integrated circuit (not shown). Owing to this, the refractive index of the tip end of the electrooptic material 72B of the optical probe 72 is changed. More specifically, there is changed a difference between the refractive indexes of ordinary light and extraordinary light in a plane perpendicular to the optical axis in optically uniaxial crystal.

The optical beam emanating from the low noise pulsed light source 73 enters the collimator 84 of the optical probe 72 through the focusing lens 74 and the optical fiber 75, and is converted as an intensity I optical beam with a predetermined polarized component by the polarizer 87 and is incident on the electrooptic materials 72A, 72B of the optical probe 72 through the beam splitter 89. Herein, each of the intensities of the reference and incident lights splitted by the beam splitter 89 is of I/2. Since the refractive index of the tip end 83 of the electrooptic material 72B is changed owing to the voltage on the object as described above, the incident light on the electrooptic material 72B is changed in its polarization state a the tip end of the electrooptic material 72B depending on the change in the refractive index of that tip end and reaches the reflecting mirror 83, on which mirror it is turn reflected back toward the beam splitter 89 as exit light from the electrooptic material 72B. Assumed here the length of the electrooptic material 72B to be 1, the polarization state of the incident light is changed in proportion to the difference between the refractive indexes of the ordinary light and the extraordinary light and to the length 1. The exit light returned back to the beam splitter 89 enters the analyzer 88.

Herein, the intensity of the exit light incident on the analyzer 88 is of I/4 owing to the beam splitter 89. Provided the analyzer 88 is constructed so as for only an optical beam of a polarized component perpendicular to the polarization direction of the polarizer 87 to pass therethrough, the intensity I/4 exit light changed in its polarization state and entering the analyzer 88 is modulated in its intensity by the analyzer 88 as $(I/4) \sin^2[(\pi/2) \cdot V/V_0]$, and is incident on the photoelectric converter element 80. Herein, V is the voltage on the object, and $V_0$ is half-wavelength voltage.

In the comparater circuit 81, there are compared the intensity I/2 of the reference light converted photoelectrically in the photoelectric converter element 77 and the intensity $(I/4) \cdot \sin^2[(\pi/2)V/V_0]$ of the exit light converted photoelectrically in the photoelectric converter element 80.

Since the intensity of the exit light $(I/4) \cdot \sin^2[(\pi/2)V/V_0]$ is altered by the change in the refractive index of the tip end 83 of the electrooptic material 72B caused by the voltage change, voltage of an object to be measured, e.g., a predetermined portion of an integrated circuit can be detected on the basis of the alteration of the exit light intensity.

In the voltage detector device 70 illustrated in FIG. 12, as described above, voltage of a predetermined portion of an object is detected on the basis of the change in the refractive index of the tip end of the electrooptic material 72B which is changed as the tip end of the optical probe 72 approaches the object. Accordingly, there can be detected, without contact with the optical probe 72, voltage of a fine portion of an integrated circuit which is particularly difficult in contact with external means and in which measured voltage is badly affected by contact, if possible, with such external means. Further, with use of the low noise pulsed light source 73 including a laser diode which emits a very short duration optical pulse as the light source, a high speed voltage change can accurately be detected by sampling the high speed voltage change of the object at a ultrashort time interval.

It should now be noticed that many electrooptic materials such as one used in the optical probe 72 of the voltage detector device 70 illustrated in FIG. 12 after demonstrates inherent double refraction. In optical uniaxial crystal lithium tantalate ($LiTaO_3$) for example, there is produced a phase difference between ordinary and extraordinary lights of incident light caused by the inherent double refraction proportional to a difference between the refractive indexes $n_0$ and $n_e$ of the ordinary and extraordinary lights. The phase difference so caused by the inherent double refraction can be produced even without the application of any voltage to such an optical uniaxial crystal, and alter the polarization state of the incident light. It is therefore needed to cancel out the phase change in the incident light due to the spontaneous double refraction when it is contemplated that only the change in the polarization state of the incident light due to the refractive index changes upon application of voltage thereto is extracted to accurately detect the voltage of an object to be measured.

Further, for highly sensitively detecting voltage of a predetermined portion of an object, a DC component is must be removed from the exit light emanating from the analyzer 88.

More specifically, in the case where the voltage of the predetermined portion to be measured is one changing at a high speed superimposed on the DC voltage, it is necessary to remove the change in the polarization state which depends on the DC voltage, because only the voltage component changing at a high speed should here be detected.

To solve this, there is known a technique wherein a phase compensator is provided between the beam splitter 89 and the electrooptic material, which compensator is in turn adjusted to single out only one due to voltage applied to the electrooptic material as the change in the polarization state of the exit light emanating from the electrooptic material. This technique however suffers from a problem that even though the phase compensator is adjusted manually to the predetermined value at the initiation of the voltage detection, the adjusted value set upon the initiation of the voltage detection is inadequate and obstructs an accurate result from being detected over the entire period of the voltage detection.

In the above embodiment, in addition to the provision of the electrooptic material 72B subject to the influence of the voltage of a predetermined portion of an object to be measured, there is disposed the electrooptic material 72A which comprises the same material as that of the electrooptic material 72B and has the same length in the direction of the optical probe's axis as that of the same such that the latter electrooptic material 72A is perpendicular in its optical crystal axis to the optical crystal axis of the former. With the electrooptic material 72A not including therein any electric field, hereby, the changes in the polarization state of the optical beam based on the phase differences by the spontaneous double refractions of the electrooptic materials 72A, 72B can be cancelled each other. Thus, the polarization state of the exit light incident on the analyzer 88 can be changed with respect to the polarization state of the incident light by the amount dependent on only the voltage applied to the electrooptic material 72B.

Hereby, there is required no complicated operation upon the initiation of the voltage detection such as the adjustment of the phase compensator, and even though the ambient temperature varies, the phase changes in the optical beam by the spontaneous double refraction of the electrooptic materials 72A, 72B are changed quite similarly so that the changes in the polarization state of the optical beam based on the phase differences of the same by the spontaneous double refractions can be cancelled at all times.

Figure 13:
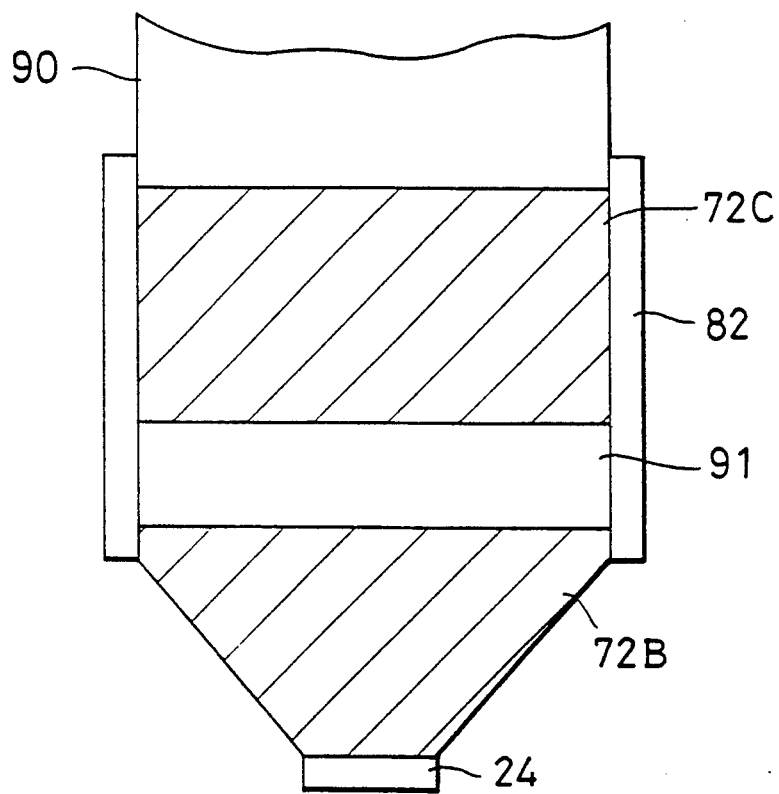
FIGS. 13 and 14 are side views each likewise illustrating the second and third embodiments.

Although in the above embodiment the phase differences by the spontaneous double refractions of the electrooptic materials are compensated by permitting the first and second electrooptic materials to the disposed such that their optical crystal axes are perpendicular to each other, this may be achieved by other means such as a λ/2 plate 91 for example, instead of the optical probe 90 of the second embodiment of the voltage detector device illustrated in FIG. 13 in which the optical crystal axes of the electrooptic materials 72C and 72B are located perpendicularly to each other.

Herein, the conductive electrode 82 has been provided on the electrooptic material 72C, the outer periphery of the λ/2 plate 91, and part of the outer periphery of the electrooptic material 72B. The conductive electrode 82 is kept at ground potential and so no electric field is existent in the electrooptic material 72C.

Figure 14:
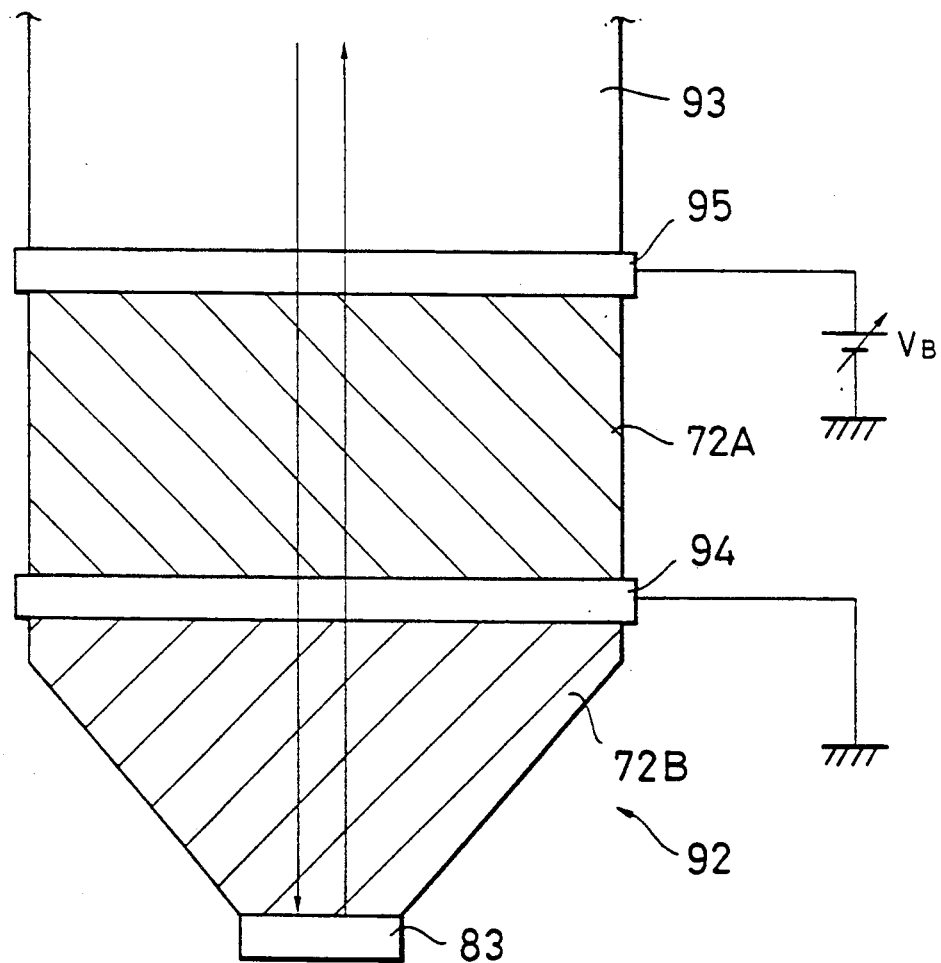

Referring to FIG. 14, there is illustrated in a sectional view, a portion of the third embodiment of the voltage detector device according to the present invention.

In a voltage detector device 92 of FIG. 4, the same low noise pulsed light source 73 as that described above is used, and there are disposed in an optical probe 93 two electrooptic materials 72a, 72B with their lengths equal to each other in the direction of the optical probe's axis and with their optical crystal axes directed perpendicularly to each other as in the voltage detector device 70 of FIG. 12. Further, a transparent electrode 94 is interposed between the electrooptic materials 72A and 72B and a transparent electrode 95 is provided oppositely to the side of the electrooptic material 72A where the former transparent electrode 94 is provided.

The transparent electrodes 94, 95 transmit incident light upon and exit light from the electrooptic materials 72A and 72B. In use, the transparent electrode 94 is kept at the ground potential and the transparent electrode 95 is subject to variable voltage $V_B$. Accordingly, the electrooptic material 72B changes its refractive index owing to a potential difference between the voltage of an object to be measured and the ground potential of the transparent electrode 94, while the electrooptic material 72A changes its refractive index owing to a potential difference between the variable voltage $V_B$ exerted on the transparent electrode 95 and the ground potential of the transparent electrode 94. Herein, the transparent electrode 94 is disposed parallely to the reflecting mirror 83 such that electric lines of force from the object through the reflecting mirror 83 is parallely to the central axis of the electrooptic material 72B in the electrooptic material 72B. Hereby the refractive index change is made uniform everywhere in the electrooptic material 72B. The transparent electrode 95 is likewise disposed to be parallel to the transparent electrode 94, so that the refractive index change is made uniform everywhere in the electrooptic material 72A.

Figure 15:
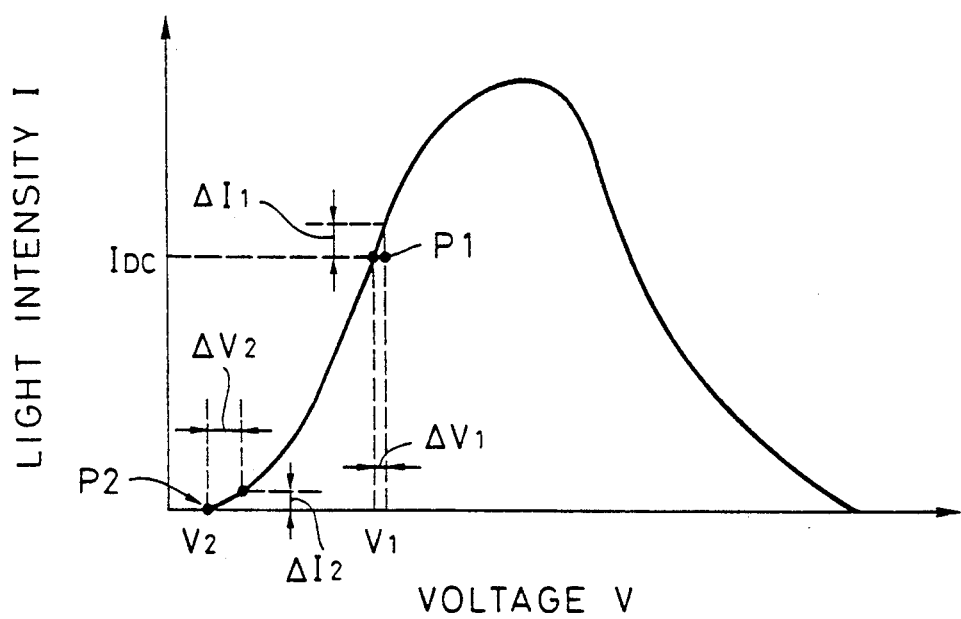
FIG. 15 is a block diagram illustrating the voltage depending of exit light intensity.

In the voltage detector device 92 constructed as above, the electrooptic materials 72A and 73B are equal in their lengths to each other and perpendicular in their optical crystal axes as in the voltage detector device 70 of FIG. 1, so that the phase differences by the spontaneous double refractions of those electrooptic materials can be cancelled at all times even though the ambient temperature varies. Additionally, provided with application of the predetermined voltage $V_B$ to the transparent electrode 95 a predetermined refractive index change is produced in the electrooptic material 72A, an operating point shown in FIG. 15 can be shifted from P1 to P2 to eliminate a DC component from the polarization state of the exit light from the electrooptic material 72B. Further, the intensity of the exit light at the operating point P2 is changed as the ambient temperature is changed. Accordingly, provided the operating point P2 is slightly shifted by automatically changing the voltage $V_B$ following the temperature change, the variations of the exit light intensity caused by the ambient temperature can be compensated. More specifically, provided the voltage $V_B$ is automatically changed following the temperature change to change the refractive index of the electrooptic material 72A, the exit light intensity is prevented from varying as the ambient temperature changes.

According to the present embodiment, the electrooptic material 72A and 72B can be controlled at all times such that the phase difference of the incident light by the spontaneous double refraction of the electrooptic material can be cancelled at all times, and that the operating point can be set so as for the DC component to be eliminated from the exit light intensity by applying the variable voltage $V_B$ to the transparent electrode 95, and further that the exit light intensity from which the DC component has been eliminated can be compensated so as not be varied by the temperature change.

Figure 16:
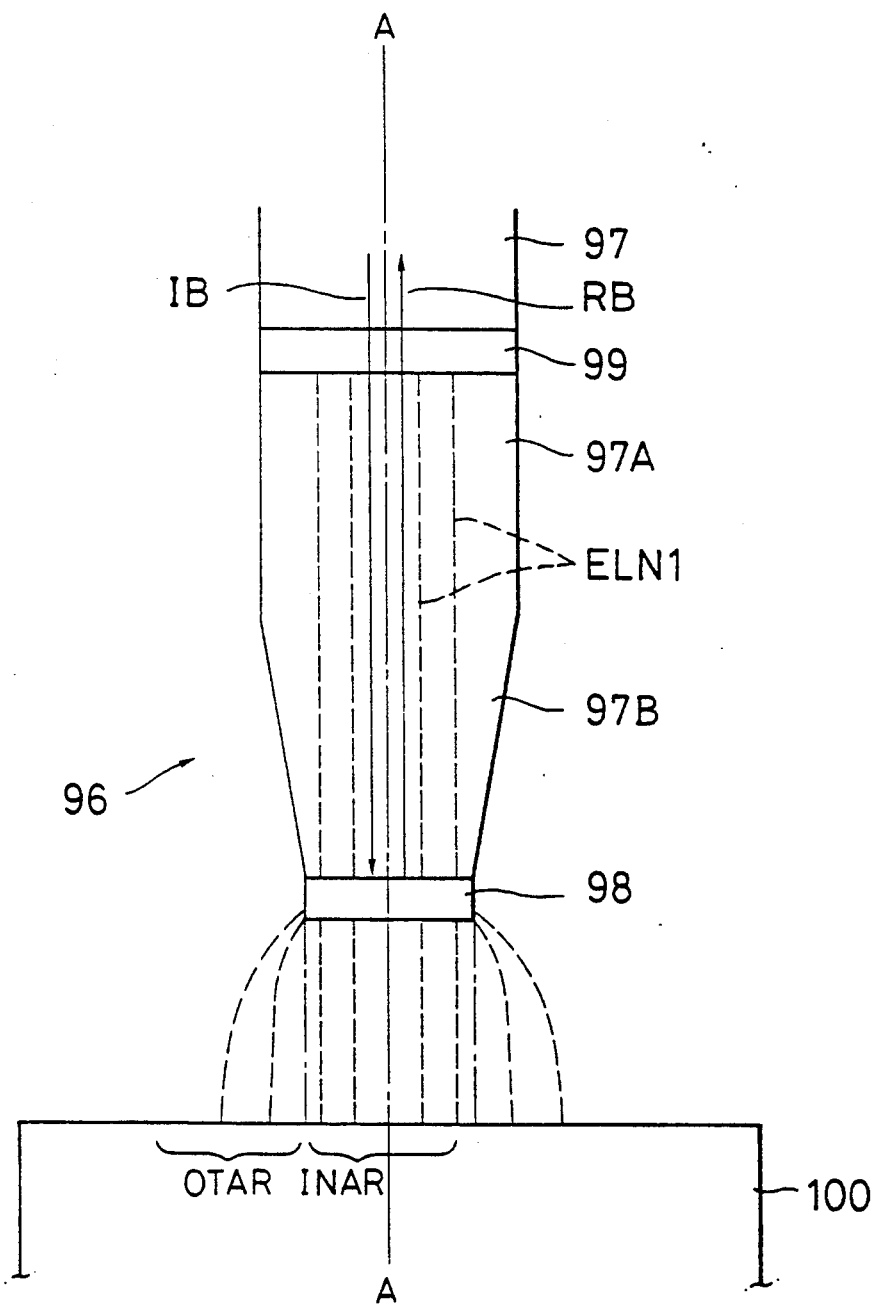
FIG. 16 is a front view illustrating a portion of the fourth embodiment of the voltage detector device.

In the following, a fourth embodiment of the voltage detector device of the present invention will be described with reference to FIG. 16.

In a voltage detector device 96, there is provided an electrooptic material 97A with its frusto-conical tip end 97B such as optically uniaxial crystal lithium tantalate ($LiTaO_3$) and lithium niobate ($LiNbO_3$), etc., is provided in an optical probe 97 as in the aforementioned voltage detector device, and there is provided a metal thin film reflecting mirror 98 on the tip end 97B of the electrooptic material 97A for reflecting incident light IB having a predetermined polarized component as exit light RB. Herein, the metal thin film reflecting mirror 98 reflects the incident light IB thereon as described previously and includes voltage at a predetermined portion of an object to be measured.

Also in the voltage detector device 96, a transparent electrode 99 with its surface directed perpendicularly to the central axis A—A of the optical probe 97 is provided above the electrooptic material 97A. The transparent electrode 99 is coated thereon with an antireflection film. The transparent electrode 99 transmits the incident light IB and reflected light RB without affecting those light and makes uniform a refractive index change in the electrooptic material 97A caused by the voltage at the predetermined portion of the object.

Herein, since in the present embodiment, excepting the provision of the optical probe 97 constructed with the single electrooptic material 97A, the reflecting mirror 98, and the transparent electrode 99, the low noise pulsed light source 73 and other arrangement are the same as that in the embodiment illustrated in FIG. 12, and hence the illustration and description thereof will be omitted.

In the voltage detector device 96 constructed as described above, once the optical probe 97 is approached to an object 100 to be measured, the voltage at the predetermined portion of the object is induced on the metal thin film reflecting mirror 98. More specifically, there is induced on the metal thin film reflecting mirror 98 a potential caused by voltage of part INAR of the object located just under the reflecting mirror 98 and voltage of part OTAR located outside the part INAR. When the transparent electrode 99 is kept at ground potential for example, there is generated in the electrooptic material 97A an electric line of force ELN1 on the basis of a potential difference between the potential of the metal film reflecting mirror 98 and the ground potential of the transparent electrode 99. It should here be noticed that the surface of the transparent electrode 99 is positioned to be perpendicular to the central axis A—A of the optical probe 1 and the transparent electrode 99 is positioned to be parallel to the metal thin film reflecting mirror 98, so that the electric line of force ELN1 generated in the electrooptic material 97A is parallel to the central axis A—A of the electrooptic material 97A. Hereby, the refractive index change of the electrooptic material 97A caused by the electric line of force ELN1 is made uniform over the whole of the electrooptic material 97A, and so the optical beams in the electrooptic material 97A, i.e., the polarized components of the incident light IB and of the reflected light RB are changed accurately corresponding to the voltage of the predetermined portion of the object to permit the voltage of the predetermined portion of the object 100 to be accurately detected.

Herein, although in the optical probe 97 of the voltage detector device the metal thin film reflecting mirror 98 was mounted on the tip end 97B of the electrooptic material 97A, it may be a dielectric multi-layer film.

In the following, a fifth embodiment of the voltage detector device will be described with reference to FIG. 17.

In a voltage detector device 101, an electrooptic material 102 is fixedly mounted in close vicinity of or in contact with an object to be measured such as an IC (integrated circuit) 56, etc. The electrooptic material 102 is formed into a columnar or plate shape with its section so cut out as to be enough large compared with that of the electrooptic material contained in the optical probe of the conventional voltage detector device and as to cover a plurality of measurement positions on the IC 56. Further, a metal or dielectric multi-layer film reflecting mirror 103 is formed on the bottom of the electrooptic material 102. In the case with the metal reflecting mirror formed, the measurement should be done without making contact with the IC 56 or through an insulator disposed on the surface of the IC 56.

The voltage detector device 101 includes a low noise pulsed light source 73, a polarizer 104 for extracting a specific polarized component from an optical beam emitted from the low noise pulsed light source 73, two movable mirrors 105, 106 for guiding a predetermined polarized component optical beam extracted through the polarizer 104, a beam splitter 107 for directing to the electrooptic material 102 as incident light the optical beam guided by the movable mirrors 105, 106 and splitting exit light from the electrooptic material 102, an analyzer 109 for extracting a predetermined polarized component from the exit light splitted by the beam splitter 107 and changed in its polarization state, and a detector 110 for receiving exit light from the analyzer 109.

An electric signal detected by the detector 110 is fed to a computer 111, subject to data processing in the same, stored in a memory (not shown), and displayed on a display 112 upon completion of the voltage detection processing.

In the voltage detector device 101, the electrooptic material 102 is cut out so as to cover the plurality of measurement positions of the IC 56 to successively detect voltages at the plurality of measurement positions of the IC 56, as described previously. Thereupon, the incident light is scanned in the directions of X and Y axes as illustrated in FIG. 17 and is satisfactorily focused for its incidence on the electrooptic material 102.

The movable mirror 105 to provided for scanning of the incident light in the X axis direction, while the movable mirror 106 provided for scanning of the same in the Y axis direction. More specifically, the movable mirrors 105, 106 are driven by a driving circuit 113 controlled by the computer 111 when the computer 111 judges the voltage detection at a certain measurement position on the IC 56 has been completed, to successively scan the optical beam in the directions of the X and Y axes.

Figure 18:
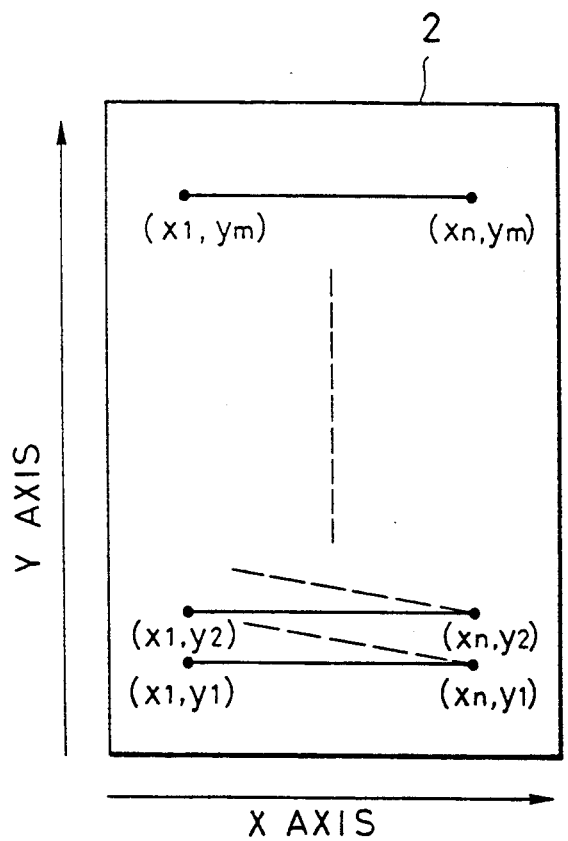
FIG. 18 is a block diagram illustrating how to operate in the fifth embodiment.

In the voltage detector device 101 arranged as described above, the optical beam from the low noise pulsed light source 73 is extracted in its specific polarized component by the polarizer 104, which component is in turn guided by the movable mirrors 105, 106 and satisfactorily stopped through the beam splitter 107 for incidence on the electrooptic material 102. The movable mirrors 105, 106 are assumed to be first set such that the incident light enters the electrooptic material 102 at a location $(x_1, y_1)$ illustrated in FIG. 18 for example. Since a portion of the electrooptic material 102 at the location $(x_1, y_1)$ is changed in its refractive index corresponding to the voltage of the object located just under that portion, the incident light entering the electrooptic material 102 at that location $(x_1, y_1)$ is changed in its polarization state is response to that refractive index change, and is reflected on a reflecting mirror 103, allowed to emanate as exit light from the electrooptic material 102, and is received by the detector 110 through the beam splitter 107 and the analyzer 109. The detector 110 detects the voltage of the IC 56 at the measurement position of the same located just under the portion of the electrooptic material 102 at the location $(x_1, y_1)$ of the same, and feeds it to the computer 111. The computer 111 executes the predetermined data processing for the voltage at the measurement position of the IC 56 located just under the portion at the detected location $(x_1, y_1)$, stores it in the memory (not shown), and controls the driving circuit 113 which in turn drives the movable mirror 105 for detecting voltage at a measurement position of the IC 56 located just under a portion of the electrooptic material 102 at a next scanned position of the same. Hereby, the movable mirror 105 is moved in the direction of the axis X so as cause the incident light to enter the electrooptic material 102 at the next scanned position of the same for the same voltage detection processing as in the above description.

Once the movable mirror 105 is successively moved in such a manner in the direction of the axis X, the incident light is set to enter the electrooptic material 102 at the location $(x_n, y_1)$ of the same, and voltage at a measurement position of the IC 56 located just under a portion of the electrooptic material 102 at a location $(x_n, y_1)$ of the same has been detected, the computer 111 controls the driving circuit 113 such that the latter drives the movable mirrors 105, 106 for scanning in the direction of the axis X at the next location $y_2$ in the direction of the axis Y. Hereby, the movable mirror 106 is set such that the incident light enters the electrooptic material 102 at the next scanned position y₂ in the direction of the axis Y, and the movable mirror 105 is moved from the position x₁ to the position x_n successively for the same voltage detection processing as described above at the locations from the location (x₁, y₂) to the location (x_n, y₂) of the electrooptic material 102.

The movable mirror 106 is set such that the incident light enters the electrooptic material 102 at the scanned location y_n in the direction of the axis Y and the movable mirror 105 is moved successively from the location x₁ to the location x_n to detect voltages at locations from the location (x₁, y_m) to the location (x_n, y_m) of the electrooptic material 102 for the completion of the voltage detection at a plurality of the measurement locations of the IC 56. Herein, a voltage detection result at each measurement position stored in the memory (not shown) of the computer 111 upon the completion of the voltage detection is displayed on the display 112.

In the voltage detection device 101 in the present embodiment arranged as described above, the optical beam stopped onto the electrooptic material 102 is successively scanned in the state of the electrooptic material 102 being fixed and is allowed to be incident upon the electrooptic material 102 to detect the voltages at a plurality of measurement positions of the IC 56.

Herein, an acoustooptic deflector may be incorporated instead of the movable mirrors 105, 106. The acoustooptic deflector is driven by a driving circuit controlled by the computer 111 to deflect the optical beam from the polarizer 104 in the directions of the axes X and Y.

Figure 17:
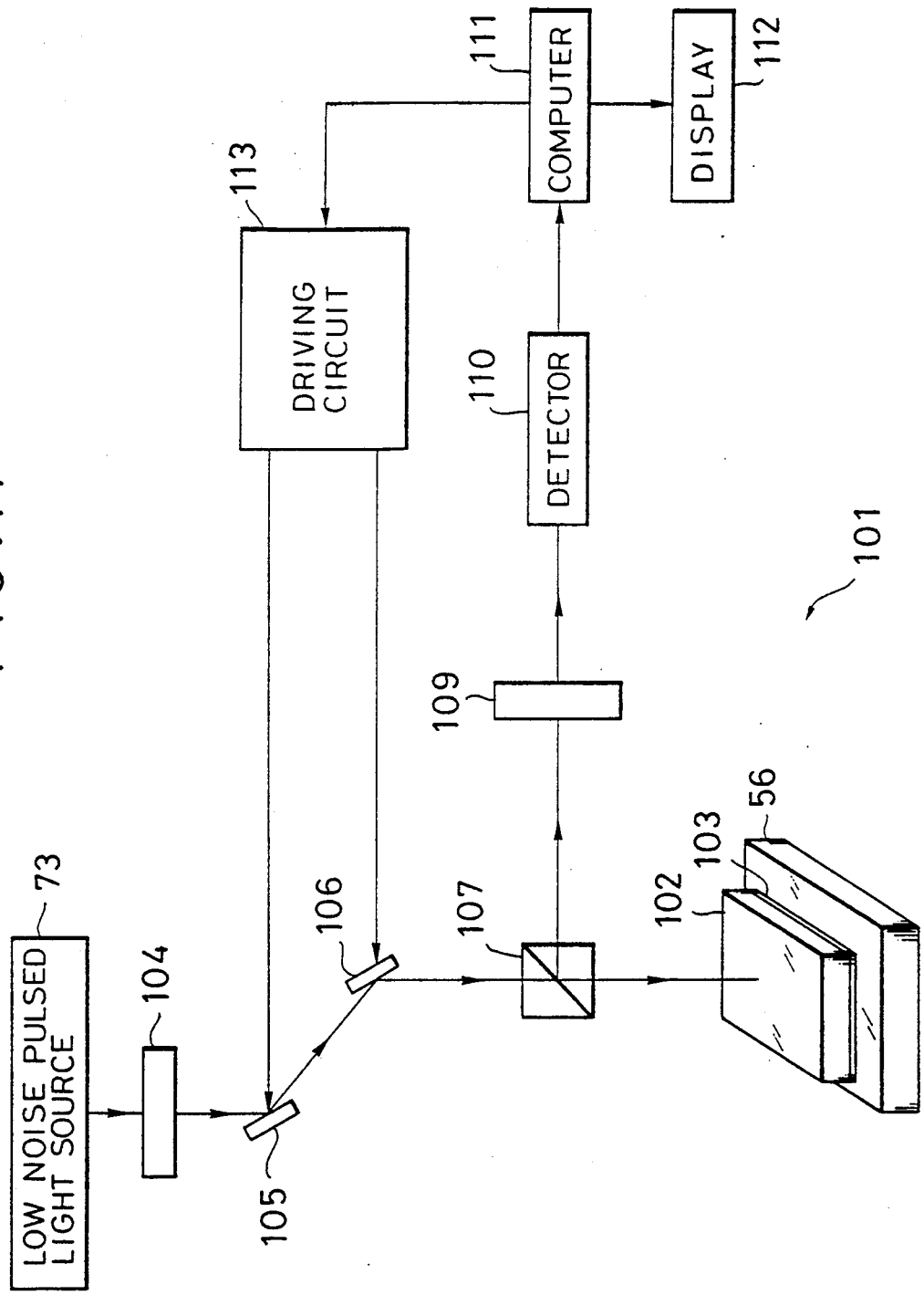
FIG. 17 is a block diagram illustrating a fifth embodiment of the voltage detector device.

Hereby, it is possible, in quite the same manner as in the voltage detector device 101 illustrated in FIG. 17, to detect voltage of an object to be measured such as the IC 56 and the like at a plurality of measurement positions on the object by directing the stopped optical beam to the electrooptic material 2 and scanning successively the optical beam in the directions of the axes X and Y.

Additionally, although in the voltage detector device 101 the optical beam from the low noise pulsed light source 73 was deflected and scanned, the electrooptic material 102 may instead be scanned by moving the electrooptic material 102 and the object in the directions of the axes X and Y.

In this case, the optical beam from the light source 73 and the polarizer 104 is adapted to directly enter the electrooptic material 102 without being polarized from the beam splitter 107 without intervention of the movable mirrors 105, 106 or the acoustooptic deflector. Herein, the optical beam incident upon the electrooptic material 102 has satisfactorily stopped. On the other hand, there is driven a motor table for moving both the electrooptic material 102 and the object in the directions of the axes X and Y, respectively, through the driving circuit controlled by the computer 111.

Herein, although in the above description both the electrooptic material 102 and the object were moved, only the object may be moved.

In the following, a sixth embodiment of the voltage detector device will be described with reference to FIG. 19.

Figure 19:
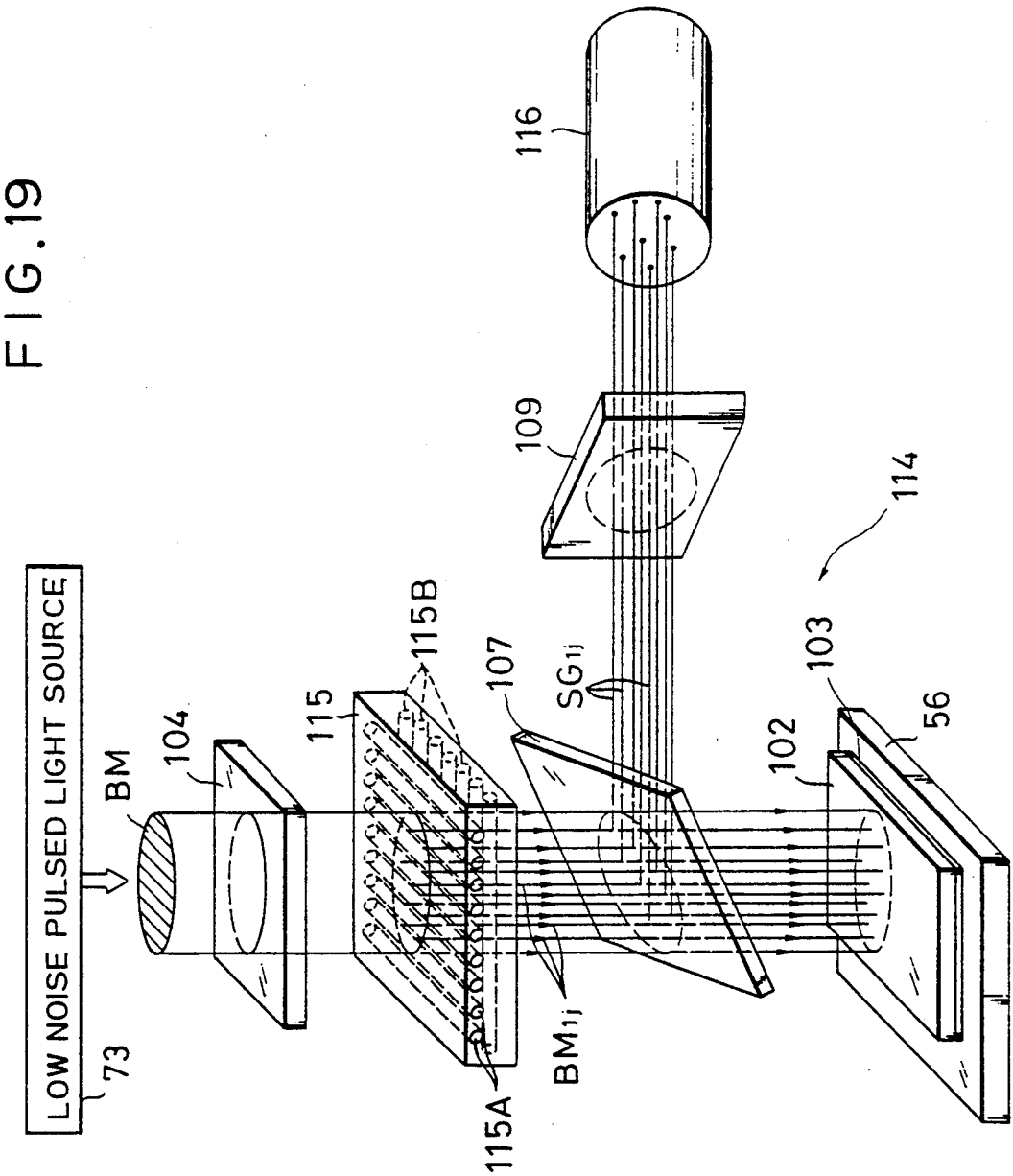
FIG. 19 is a perspective view illustrating a sixth embodiment of the voltage detector device.

In a voltage detector device 114 of FIG. 19, the electrooptic material 102 is cut out into a size in its cross section so as to cover a plurality of two-dimensional locations of an object to be measured such as the IC 56 and the like, as in the foregoing embodiment of FIG. 17.

A metal or dielectric multi-layer reflecting mirror 103 is formed on the bottom of the electrooptic material 102.

The voltage detector device 114 includes a polarizer 104 for extracting a predetermined polarized component from an optical beam BM emitted from a low noise pulsed light source 73, a microlens array 115 for dividing an optical beam of the predetermined polarized component extracted by the polarizer to many optical beams $BM_{ij}$ exhibiting together a lattice-shaped pattern, a beam splitter 107 for directing the lattice-shaped pattern many optical beams $BM_{ij}$ divided by the microlens array 111 as incident light toward the electrooptic material 102, and for splitting for voltage detection a lattice-shaped pattern many exit lights $SG_{ij}$ reflected on the reflecting mirror 103 disposed on the bottom of the electrooptic material 102 and emanating from the electrooptic material 102, an analyzer 109 for transmitting therethrough only an optical beam of a predetermined polarized component among the exit lights $SG_{ij}$ from the beam splitter 107, and a detector 116 for receiving the exit light transmitted by the analyzer 109.

The microlens array 115 comprises a plurality of first rod lenses 115A all aligned in a specific direction, and a plurality of second rod lenses 115B all aligned in the direction perpendicular to the first rod lenses, both being superimposed, whereby the optical beam is divided into a lattice-shape.

The detector 116 comprises a two-dimensional photodetector such as a CCD camera, a photodiode array, and a vision camera, etc., and a high speed detector such as a streak camera, etc.

In the voltage detector device 114 arranged as described above, the electrooptic material 102 is cut out in its section into a size to cover a plurality two-dimensional positions on the IC 56. Accordingly, there are changed refractive indexes of local portions on the electrooptic material 102 corresponding to the two-dimensional positions owing to the voltages at those plurality of the two-dimensional positions of the IC 56.

Therefore, when many optical beams $BM_{ij}$ of the lattice-shaped pattern having the predetermined polarized component divided by the microlens array 115 propagate along the lattice-shaped part in the electrooptic material 102, those optical beams $BM_{ij}$ are changed in their polarization states owing to the refractive index change at at the lattice-shaped part in the electrooptic material 102 caused by the voltages at the lattice-shaped positions on the IC 56 just under the lattice-shaped part, and allowed to emanate from the electrooptic material 102 as exit lights. These exit lights enter the analyzer 109 via the beam splitter 107. Provided the analyzer 109 is adapted to transmit therethrough only the optical beam of the polarized component perpendicular to the polarization direction of the polarizer 104 for example, the exit lights $SG_{ij}$ changed in the polarization states and entering the polarizer 109 are changed in their intensity by the polarizer 109 as being proportional to $\sin^2[(\pi/2)V_{ij}/V_0]$, and allowed to enter the photodetector 116. Herein, $V_{ij}$ to the voltage at the two-dimensional lattice position (i, j) on the IC 56, and $V_0$ is a half-wave voltage.

In such a manner, the intensity of each exit light is changed owing to the refractive index of the local portion on the electrooptic material 102 following the voltage change at each lattice position on the IC 56. On the basis of this, in the detector 116, only the voltages at the two-dimensional lattice positions among overall two-dimensional positions on the object such as the IC 56 can simultaneously be detected.

In the present embodiment, although many optical beams $BM_{ij}$ two-dimensional lattice-shaped pattern were formed with use of the microlens array 115, and allowed to enter the electrooptic material 102 to detect the voltages at the two-dimensional lattice positions of the object, there may sometimes be a case where it is desired to detect voltages at arbitrary two-dimensional positions on the object.

In this case, it is possible to detect the voltages at the arbitrary two-dimensional positions on the object by disposing a plate-shaped mask behind the microlens array 115, and extracting only desired optical beams using that mask and directing to permit those beams to the electrooptic material 102.

Further, a holographic lens may be employed, instead of the microlens array 115 on which such a hologram has been recorded that the optical beam is focused only at a specific two-dimensional portion on the electrooptic material 102.

Additionally, a spatial light modulator may be employed instead of the microlens array.

In the following, a seventh embodiment of the voltage detector device will be described with reference to FIG. 20.

Figure 20:
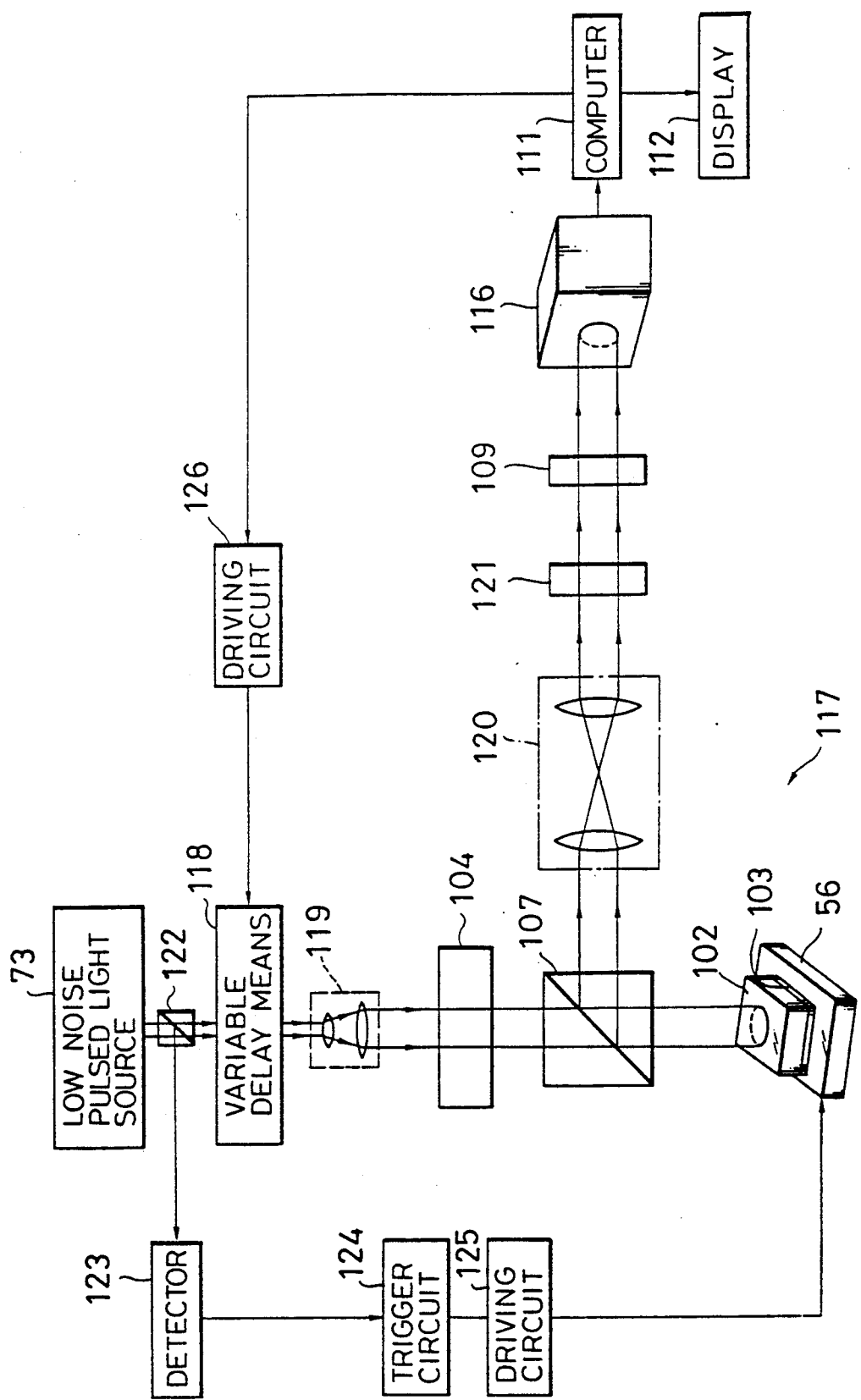
FIGS. 20 and 21 are block diagrams each illustrating seventh and eighth embodiment of the voltage detector device.

Also in a voltage detector device of FIG. 20, a similar electrooptic material 102 to those described in the embodiments of FIGS. 17 and 19 is disposed in close vicinity to an object to be measured such as the IC 56 or brought into contact with and fixed to the IC 56. The electrooptic material 102 is cut down, in its section, into an enough size to cover a plurality of two-dimensional positions on the object. Further, there is formed a reflecting mirror 103 comprising a metal or dielectric multi-layer film on the bottom of the electrooptic material 102.

The voltage detector device 117 includes a low noise pulsed light source 73 for emitting a very short pulse duration optical beam, variable delay means 118 for variably delaying the optical beam from the low noise pulsed light source 73, an expanding optical system 119 for expanding and collimating the optical beam delayed by the variable delay means 118 to a two-dimensional expanse, i.e., an expansed and collimated optical beam, a polarizer 104 for extracting a predetermined polarized component from the optical beam collimated by the expanding optical system 119, a beam splitter 107 for directing the collimated light, i.e., optical beam having the predetermined polarized component extracted by the polarizer 104 to the electrooptic material 102 and splitting for the voltage detection exit light reflected on the reflecting mirror 103 formed on the bottom of the electrooptic material 102 and emanating from the electrooptic material 102 and directly the splitted exit light toward a focusing optical system, a phase compensator for adjusting the phase of exit light from the focusing optical system, an analyzer 109 for transmitting therethrough only an optical beam having a predetermined polarized component in the exit light adjusted in its phase by the phase compensator 121, and a photodetector 116 for receiving the exit light transmitted through the analyzer 109.

The collimated light incident upon the electrooptic material 102 is expanded by the expanding optical system 119 into the two-dimensional expanse, and allowed to enter the electrooptic material 102 uniformly with the predetermined expanse. The collimated light incident uniformly upon the electrooptic material 102 is changed in its polarization state owing to the refractive index changes of two-dimensional portions corresponding to two-dimensional positions on the electrooptic material 102, the change being caused by voltages at a plurality of the two-dimensional positions of the IC 56 as the object, because the electrooptic material 102 has been cut down in its section into a size enough to cover those two-dimensional positions on the object, and is allowed to emanate from the electrooptic material 102 as exit light. In other words, the exit light emanating from the electrooptic material 102 has identical spreading to that of collimated light, and the changes in the polarization states at various parts of the exit light reflect the voltages at the respective two-dimensional positions on the object.

The phase compensator 121 is to adjust the phase of the exit light and is to set the polarized component of the exit light extracted by the analyzer 109 to a predetermined angle with respect to that of the collimated light extracted by the polarizer 104, i.e., it is to arrange the polarized component of the exit light extracted by the analyzer 109 in the same direction as or perpendicularly to that of the collimated light extracted by the polarizer 104.

The detector 116 is a two-dimensional photodetector such as a CCD camera, a photodiode array, and a vidicon camera, etc., and is to detect the intensity of the exit light from the analyzer 109 for simultaneous detection of the voltage at the two-dimensional positions on the object based upon the changes in the refractive indexes of the electrooptic material 102.

In the case where the low noise pulsed light source 73 and the two-dimensional detector 116 are employed in combination, the voltages at the two-dimensional positions on the object must be changed periodically in synchronism with the optical pulse. More specifically, the optical beam from the low noise pulsed light source 73 is halved into two optical beams by the beam splitter 122, one of which is fed to the variable delay means 118 for sampling and the other of which is sent to the detector 123 for photoelectric conversion. An electric signal yielded by the photoelectric conversion reaches the driving circuit 125 via the trigger circuit 124 to actuate the object periodically in synchronism with the optical pulse. Such repeatedly varying voltage is detected by the sampling. The sampling is achieved by gradually delaying the optical beam from the low noise pulsed light source 73 by the variable delay means 118, and such operation of the variable delay means 118 is controlled by the computer 111. More specifically, after the detector 116 detects the voltages at the two-dimensional positions on the IC 56 in certain timing, the computer 111 processed those voltages, and stores processed data in the memory (not shown) while controlling the driving circuit 126, which driving circuit 126 in turn drives the variable delay means 115 to delay the optical beam from the low noise pulsed light source 73 and hence slightly shift the sampling timing. Thus, temporal changes in the voltages at the two-dimensional positions on the object can be detected.

In the voltage detector device 117 arranged as such, the phase compensator 121 is first adjusted to direct the polarized component of the exit light extracted by the analyzer 109 perpendicularly to that of the collimated light extracted by the polarizer 104. Hereby, when the polarization state of the exit light from the electrooptic material 102 is the same as the collimated light incident upon the electrooptic material 102, (when no voltage is applied to the electrooptic material 102), the exit light is prevented from being transmitted by the analyzer 109. After the phase compensator 121 is set in such a manner, the voltage measurement at the two-dimensional positions on the object is started.

The electrooptic material 102 is changed in the refractive indexes thereof corresponding to the two-dimensional positions owing to the two-dimensional positions on the object because the electrooptic material 102 has been cut down in its section in to a size enough to cove the two-dimensional positions on the object (IC 56). Accordingly, the collimated light incident uniformly upon the electrooptic state owing to the changes in the refractive indexes of the two-dimensional portions on the electrooptic material 102 corresponding to the two-dimensional positions on the object, and allowed to emanate from the electrooptic material 102 as exit lights. These exit lights further enters the phase compensator 121 via the beam splitter 107 and the focusing optical system 120, and is adjusted in its phase by the phase compensator 121 and is incident upon the analyzer 109. The phase compensator 121 has been adjusted such that the analyzer 109 transmits only the optical beam of the polarized component perpendicular in that the polarizer 104, so that the intensities of the exit lights incident upon the analyzer 109 are allowed to be proportional to $\sin^2[(\pi/2)\cdot V_{ij}/V_0]$ by the analyzer 109 and to enter the analyzer 116. Herein, $V_{ij}$ is the voltage at the two-dimensional position (i, j) on the object, and $V_0$ is the half-wave voltage.

The exit lights are changed owing to the changes in the refractive indexes of local portions of the electrooptic material 102 caused by the changes in the voltages at the two-dimensional positions of the object, as described above. The detector 116 can therefore detect simultaneously the voltage at the two-dimensional positions on the object such as an integrated circuit on the basis of the refractive index changes.

As the detector 116 detects the voltage at the two-dimensional positions on the object in a certain timing, the computer 111 stores a detected result in the memory. Further, for detecting the voltage in successive timings, the computer 111 controls the driving circuit 126 to drive the variable delay means 118, whereby the optical beam from the low noise pulsed light source 73 is delayed by a predetermined amount to shift the sampling timing a little at a time for repeated like voltage detection. The temporal changes in the voltages at the two-dimensional positions on the object are thus sampled and measured. The computer 111 stores measured results in the memory, and displays those voltage detection results on the display 112 at the time the sampling measurement within a predetermined time range has been completed, and overall processings are completed.

Although in the above embodiment only the voltages at the two-dimensional positions on the object were detected and displayed on the display 112, there is sometimes a case desired by users in which a wiring configuration of an object to be measured such as an integrated circuit is further observed simultaneously with the voltage detection and the voltages at the two-dimensional positions are superimposed on and displayed with the observed wiring configuration.

Figure 21:
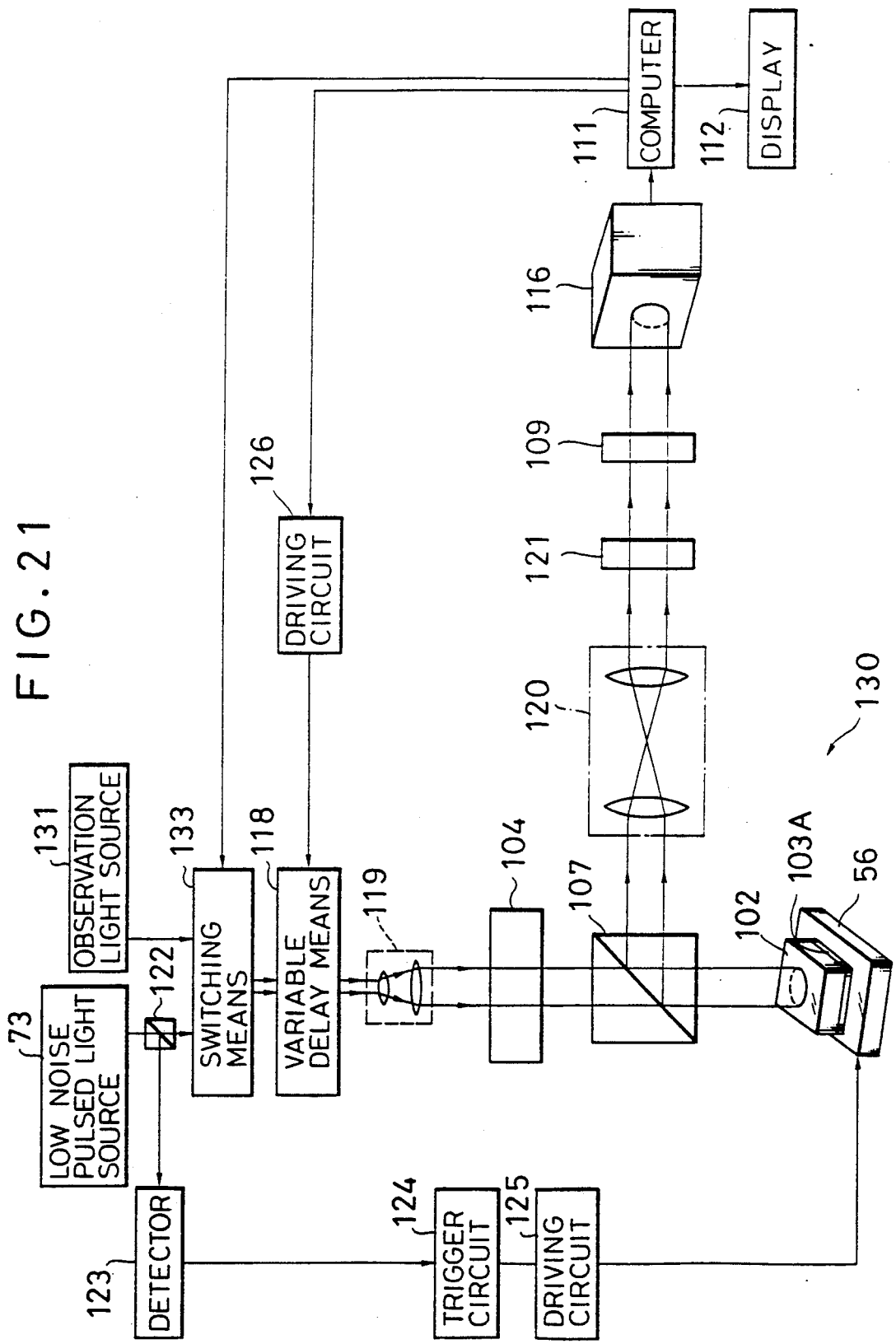

FIG. 21 is a block diagram illustrating an eighth embodiment of the voltage detector device in which the voltages at the two-dimensional positions can be displayed, superimposed on the wiring configuration of an object to be measured. Herein, the same portions as those in FIG. 20 are denoted by the same symbols in FIG. 21, and the description will be omitted.

In a voltage detector device 130 of FIG. 21, there is incorporated, independently of the low noise pulsed light source 73, an observation light source 131 for emitting pulsed light or DC light to observe the wiring configuration of an object to be measured such as the IC 56 and the like. An optical beam emitted from the observation light source 131 has its wavelength different from that of the optical beam emitted from the low noise pulsed light source 73. More specifically, the optical beam from the low noise pulsed light source 73 is reflected on the dielectric multi-layer film mirror 103A formed on the bottom of the electrooptic material 102, whereas the optical beam from the observation light source 131 is transmitted by the dielectric multi-layer film mirror and impinges on the surface of the object.

The optical beam from the observation light source 131 and the optical beam from the low noise pulsed light source 73 are switched each other by switching means 133 under the control of the computer 111. The switching means 133 selects, upon observing the wiring configuration of the object, the optical beam from the observation light source 131 and forces the optical beam to enter the object through the electrooptic material 102, whilst if selects, upon detecting the voltages at the two-dimensional positions on the object, the optical beam from the low noise pulsed light source 73 and forces the same to enter the electrooptic material 102.

The phase compensator 121, which is adjusted by the computer 111, is adjusted upon observing the wiring configuration of the object, such that the analyzer 109 transmits the exits light of the same polarized component as the polarization direction of the polarizer 104, while it is adjusted, upon detecting the voltages at the two-dimensional positions on the object, such that the analyzer 109 transmits the exit light of the polarized component perpendicular to the polarization direction of the polarizer 104.

In the voltage detector device 130 arranged as such, the computer 111 controls, first observing the wiring configuration of an object, the switching means to force the optical beam from the observation light source 131 to enter as collimated light the surface of the object, while it adjusts the phase compensator 121 such that the analyzer 109 transmits the exit light of the same polarized component as the polarization direction of the polarizer 104.

Hereby, the optical beam from the observation light source 131 enters as collimated light the electrooptic material 102 through the variable delay means 118, the expanding optical system 119, the polarizer 104, and the beam splitter 107, and is transmitted by the dielectric multi-layer film mirror 103A and permitted to enter the surface of the IC 56 being as the object. The collimated light incident upon the surface of the object is partly reflected back depending on the wiring configuration and material quality of the object surface across the dielectric multi-layer film mirror 103A and the electrooptic material 102 and enters the analyzer 109 as exit light via the beam splitter 107, the focusing optical system 120, and the phase compensator 121. Herein, the phase compensator 121 has been adjusted such at the analyzer 109 transmits the exit light of the same polarized component as the polarization direction of the polarizer 104. Accordingly, the exit light incident upon the analyzer 109 is transmitted by the analyzer 109 intactly and impinges the two-dimensional detector 116 such as a CCD camera. The exit light impinging the detector 116 involves visible image information concerning the wiring configuration on the surface of the object. The detector 116 subjects it to photoelectric conversion to yield visible image data concerning the wiring configuration. The resulting visible image data is fed to be computer 111 and stored in the memory (not shown) of the same.

After the visible image data concerning the wiring configuration of the object has been yielded, the computer 111 subjects the variable delay means 118 to initial setting, and controls the switching means 133 such that the optical beams from the low noise pulsed source 73 enters the electrooptic material 102 as collimated light. The computer 111 further adjusts the phase compensator 121 such that the analyzer 109 transmits the exit light of the polarized component perpendicular to the polarization direction of the polarizer 104, to simultaneously detect the voltages at the two-dimensional positions on the object. Thereupon, the optical beam from the low noise pulsed light source 73, after entering the electrooptic material 102 as collimated light, is reflected on the dielectric multi-layer film mirror 103A and is changed in its polarization state following the refractive index change of the electrooptic material 102, and further enters as exit light the phase compensator 121 and the analyzer 109. The analyzer 109 transmits only the exit light of the predetermined polarized component to permit it to enter the two-dimensional detector 116. The detector 116 samples and simultaneously detects the voltages at the two-dimensional positions on the object in timing set by the variable delay means 118. A result of the voltage detection in one timing is fed to the computer 111 and stored in the memory. Thereafter, the result of the voltage detection at the two-dimensional positions on the object sampled in the one timing is displayed on the display 112, superimposed on the visible image date concerning the wiring configuration of the object stored previously in the memory.

What is claimed is:

1. A voltage detector device comprising:
    a) a low noise pulsed light source having:
       i) a laser diode for emitting a repetitive pulsed light, said repetitive pulsed light having a predetermined intensity,
       ii) means for driving said laser diode, said driving means supplying at least one of a bias current and a pulse signal to said laser diode,
       iii) a photodetector for detecting part of the pulsed light emitted from said laser diode, and
       iv) a modulating means for modulating at least one of said bias current and an amplitude of said pulse signal, said modulating means modulating said bias current and said amplitude according to an output signal from said photodetector over a wide frequency band such that the predetermined intensity of said pulsed light is kept unchanged and any noise superimposed on said predetermined intensity of said pulsed light is lowered;
    b) a first electrooptic material adapted to be positioned at a predetermined portion of an object to be measured and having refractive index which is varied by an applied voltage;
    c) a second electrooptic material disposed on said first electrooptic material to compensate a phase difference caused by intrinsic double refraction of said first electrooptic material, said second electrooptic material being formed of the same material as said first electrooptic material and having the same length as that of the first electrooptic material in the direction of an optical axis and being further aligned along the optical axis, and said pulse light from said low noise pulsed light source being directed to enter said first and second electrooptic materials along the optical axis.

2. A voltage detector device according to claim 1 characterized in that said second electrooptic material has its optical crystal axis directed perpendicularly to the optical crystal axis of said first electrooptic material.

3. A voltage detector device according to claim 1 characterized in that said second electrooptic material has its optical crystal axis directed parallel to the optical crystal axis of said first electrooptic material and in that means is provided between said first electrooptic material and said second electrooptic material for rotating by 90° a polarization component of the pulsed light.

4. A voltage detector device according to claim 1, further comprising a first transparent electrode provided between said first electrooptic material and said second electrooptic material, and a second transparent electrode provided opposite to a side of said first transparent electrode on said second electrooptic material.

5. A voltage detector device according to claim 4 characterized in that said first transparent electrode is kept at earth potential, and voltage is applied to said second transparent electrode to output light from the same, said light is such that produced by removing a DC component from the polarization state of exit light from said first electrooptic material.

6. A voltage detector device comprising:
    a) a low noise pulsed light source having:
       i) a laser diode for emitting a repetitive pulsed light, said pulse light having a predetermined intensity,
       ii) means for driving said laser diode, said driving means supplying at least one of a bias current and a pulse signal to said laser diode,
       iii) a photodetector for detecting part of the pulsed light emitted from said laser diode, and
       iv) a modulating means for modulating at least one of said bias current and an amplitude of said pulse signal, said modulating means modulating said bias current and said amplitude according to an output signal from said photodetector over a wide frequency band such that the intensity of said pulsed light is kept unchanged and any noise superimposed on said predetermined intensity of said pulsed light is lowered;
    b) an electrooptic material adapted to be positioned at a predetermined portion of an object to be measured and having a refractive index which is varied by a voltage, said electrooptic material being positioned at a predetermined location in an optical probe;
    c) reflecting means provided at a tip end of said electrooptic material for reflecting said pulsed light incident upon said optical probe along a central axis of said optical probe; and
    d) a transparent electrode located on an opposite side of said electrooptic material from said reflecting means.

7. A voltage detector device according to claim 5 characterized in that a surface of said transparent electrode is substantially perpendicular to the central axis of said optical probe.

8. A voltage detector device which utilizes an electrooptic material having a refraction index varied by applied voltages on an object comprising:
   a) a low noise pulsed light source having:
      i) a laser diode for emitting a repetitive pulsed light, said repetitive pulsed light having a predetermined intensity,
      ii) means for driving said laser diode, said driving means supplying at least one of a bias current and a pulse signal to said laser diode,
      iii) a photodetector for detecting part of the pulsed light emitted from said laser diode, and
      iv) a modulating means for modulating at least one of said bias current and an amplitude of said pulse signal, said modulating means modulating said bias current and said amplitude according to an output signal from said photodetector over a wide frequency band such that the predetermined intensity of said pulsed light is kept unchanged and any noise superimposed on said predetermined intensity of said pulsed light is lowered;
   b) a electrooptic material being positioned to cover a plurality of measurement positions of the object from which voltages are to be detected;
   c) means for directing said pulsed light from said low noise pulsed light source to enter respective portions of the electrooptic material corresponding to the plurality of measurement positions of the object; and
   d) means for driving said directing means to scan an optical beam from the low noise pulsed light source to the respective portions of the electrooptic material, whereby voltages of the measurement positions of the object are detected by changes in polarization states of light emanating from said respective portions of the electrooptic material.

9. A voltage detector device according to claim 8 characterized in that said directing means is a beam splitter for dividing said optical beam from said low noise pulsed light source into many desired patterns as incident light and directing said optical beam to enter respective portions of said electrooptic material corresponding to particular positions of the object.

10. A voltage detector device according to claim 9 characterized in that said optical beam from the light source is divided to many grid-shaped pattern incident lights by a microlens array.

11. A voltage detector device according to claim 8 characterized in that said electrooptic material is positioned to cover therewith a plurality of two-dimensional positions of the object from which voltage is to be detected, and in that an optical beam from said low noise pulsed light source is directed to enter uniformly as parallel light respective two-dimensional portions of said electrooptic material corresponding to the plurality of the two-dimensional positions of the object and changes in polarizations of emanating lights from the plurality of the two-dimensional portions of said electrooptic material are detected by detectors.

12. A voltage detector device according to claim 8 characterized in that said electrooptic material is positioned to cover therewith a plurality of two-dimensional positions of the object from which voltage is to be detected, in that a short pulse optical beam from said low noise pulsed light source being directed to uniformly enter as parallel light respective two-dimensional portions of said electrooptic material corresponding to said plurality of the two-dimensional positions of the object, in that changes in polarizations of emanated lights from said plurality of the two-dimensional portions of said electrooptic material being detected by detectors, and in that it further comprises an observation light source for emitting an optical beam with a different wavelength as that of said low noise pulsed light source in order to observe the arrangement and shape of the object, switching means for switching the optical beam from said observation light source to the optical beam from said low noise pulsed light source or reversely to direct the selected optical beam to said electrooptic material, phase compensation means for adjusting, upon observing the wiring configuration of the object, emanating light phase to that different from one upon detecting the changes in said polarization states, display means for displaying voltage at the two-dimensional position of the object measured on the basis of the change in the polarization state of the emanating light superimposing said voltage on the wiring configuration of the object observed by said detector, and variable delay means for delaying incident timing of the optical beam from said low noise pulsed light source on the electrooptic material for sampling measurement changes in the voltages of the two-dimensional positions of the object.

* * * * *